United States Patent
Kadono

(10) Patent No.: US 8,313,795 B2
(45) Date of Patent: Nov. 20, 2012

(54) METHOD AND APPARATUS FOR MANUFACTURING THIN FILM, AND METHOD FOR MANUFACTURING ELECTRONIC DEVICE

(75) Inventor: Koji Kadono, Tokyo (JP)

(73) Assignee: Sony Corporation, Tokyo (JP)

( * ) Notice: Subject to any disclaimer, the term of this patent is extended or adjusted under 35 U.S.C. 154(b) by 484 days.

(21) Appl. No.: 12/538,345

(22) Filed: Aug. 10, 2009

(65) Prior Publication Data

US 2010/0040771 A1    Feb. 18, 2010

(30) Foreign Application Priority Data

Aug. 12, 2008 (JP) ................. 2008-207666

(51) Int. Cl.
*B05D 5/12* (2006.01)
(52) U.S. Cl. ........................................ 427/58
(58) Field of Classification Search .......... 427/105, 427/181, 230, 231, 512, 11, 58, 355, 356, 427/358
See application file for complete search history.

(56) References Cited

U.S. PATENT DOCUMENTS

| 2006/0134326 A1* | 6/2006 | Watanabe et al. | 427/180 |
| 2010/0233360 A1* | 9/2010 | Lee et al. | 427/99.5 |

FOREIGN PATENT DOCUMENTS

| JP | 07-000557 u | 1/1995 |
| JP | 3665969 | 4/2005 |
| JP | 2006-035129 A | 2/2006 |
| JP | 2006-298715 A | 11/2006 |

OTHER PUBLICATIONS

G. Yu et al., "Large-area blown bubble films of aligned nano wires and carbon nanotubes", Nature Nanotechnology, 2, pp. 372-377 (2007).
S. J. Kang et al., "High-performance electronics using dense perfectly aligned arrays of single-walled carbon", Nature Nanotechnology, 2, pp. 230-236 (2007).
Yeji Kim et al., "Langmuir-Blodgett Films of Single-Wall Carbon Nanotubes: Layer-by-layer Deposition and In-plane Orientation of Tubes", Japan. J. Appl. Phys. vol. 42 (2003), pp. 7629-7634.
Xiaolin Li et al., "Langmuir-Blodgett Assembly of Densely Aligned Single-Walled Carbon Nanotubes of Bulk Materials", J. Am. Chem. Soc. 2007, 129, pp. 4890-4891.
Jun Matsui et al., "Simple Fabrication of Carbon nanotube Monolayer Film", Chemistry Letters vol. 35, No. 1 (2006) pp. 42-43.

* cited by examiner

*Primary Examiner* — Michael Cleveland
*Assistant Examiner* — Tabassom Tadayyon Eslami
(74) *Attorney, Agent, or Firm* — Wolf, Greenfield & Sacks, P.C.

(57) ABSTRACT

A method for manufacturing a thin film, includes the steps of: mixing a thin-film forming material and a surfactant to prepare a dispersion in which the thin-film forming material is dispersed; forming a dispersion film from the dispersion at an inner circumference side of ring-shaped holding means; relatively moving a cylindrical supporter and the dispersion film while being in contact with each other so that the dispersion is transferred on a surface of the supporter to have a film shape, the supporter being disposed between a central portion of an inside space of the holding means and an outer circumference thereof and along an inner circumference of the holding means; drying the dispersion having a film shape formed on the surface of the supporter to form the thin film.

17 Claims, 19 Drawing Sheets

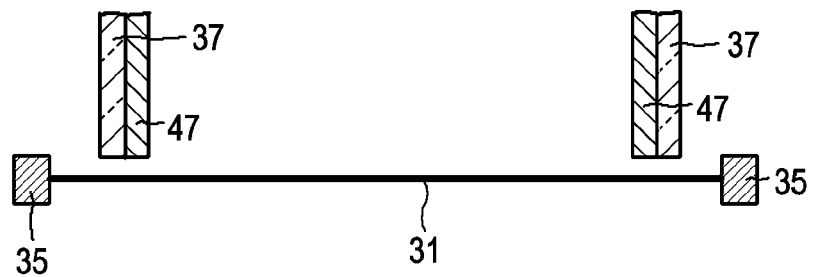
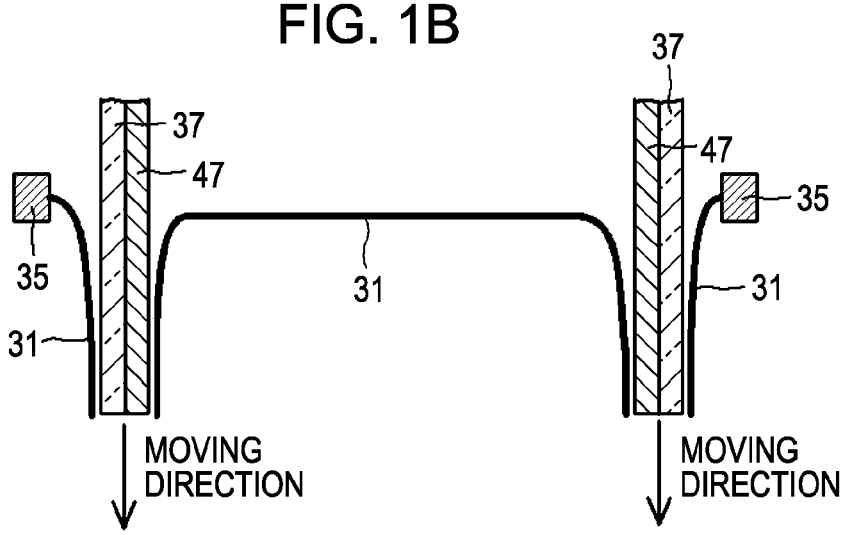
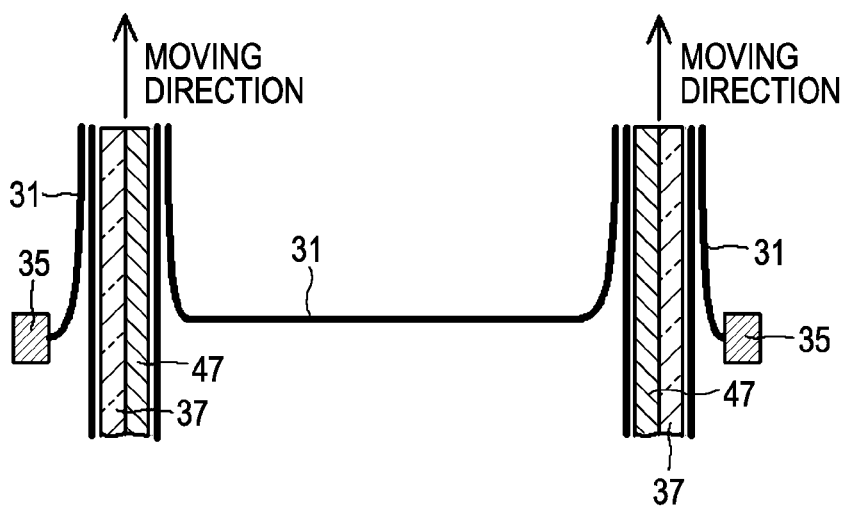

1000.0 nm 1000.0 nm

| a | ▨ 5000 TO 6000 Ω/sq |
| b | ☐ 4000 TO 5000 Ω/sq |
| c | ☐ 3000 TO 4000 Ω/sq |
| d | ☐ 1000 Ω/sq |

| | HORIZONTAL DIRECTION X | | | | |
|---|---|---|---|---|---|
| | 50 mm | 100 mm | 150 mm | 200 mm | 250 mm |
| 30 mm | 4102 | 4899 | 5254 | 5211 | 3987 |
| 60 mm | 3858 | 4920 | 4769 | 4671 | 3798 |
| 90 mm | 4793 | 4820 | 4882 | 4536 | 3655 |
| 120 mm | 3993 | 4666 | 4556 | 4160 | 3381 |
| 150 mm | 3453 | 4991 | 4489 | 4423 | 3425 |
| 180 mm | 3287 | 4243 | 4083 | 3957 | 3254 |

VERTICAL DIRECTION Y

FIG. 16A1
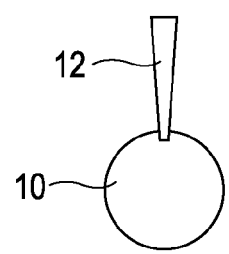
FIG. 16A2
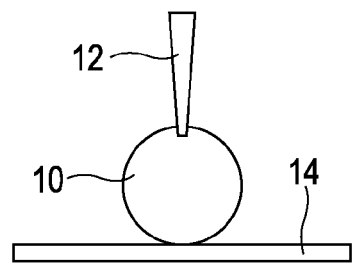
FIG. 16A3
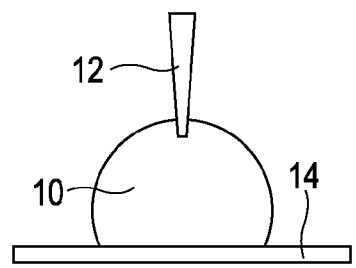
FIG. 16A4
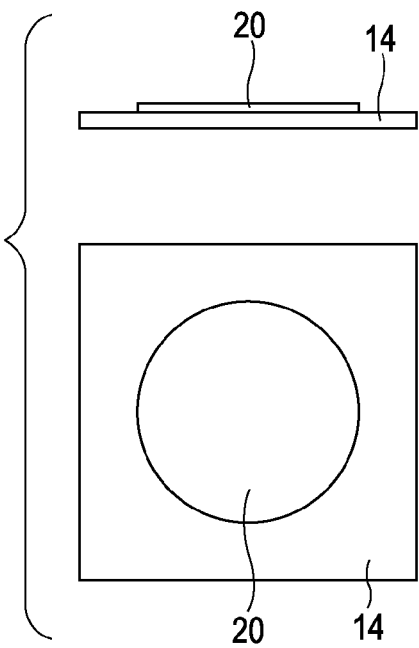

METHOD AND APPARATUS FOR MANUFACTURING THIN FILM, AND METHOD FOR MANUFACTURING ELECTRONIC DEVICE

BACKGROUND OF THE INVENTION

1. Field of the Invention

The present invention relates to a method and an apparatus for manufacturing a thin film of carbon nanotubes or the like, and a method for manufacturing an electronic device including the above thin film.

2. Description of the Related Art

Since having superior electrical and mechanical properties, carbon nanotubes (hereinafter simply referred to as "CNTs") have been expected to be widely used in various fields as a promising material for nanotechnology, and hence fundamental research and application research of carbon nanotubes have been aggressively carried out.

Heretofore, as a method for manufacturing a CNT thin film, for example, there have been a spray method in which after a liquid containing CNTs dispersed in a solvent, such as ethanol, using ultrasonic waves is sprayed on a substrate using a spraying tool, the solvent is then evaporated to form a thin film; a Langmuir Blodgett (LB) method in which after a film made of solubilized CNTs is spread out on a water surface, operation of immersing a substrate into the water in a direction perpendicular to the surface thereof and pulling it up therefrom is repeatedly performed to form a thin film; a coating method in which a solution containing CNTs is applied to a substrate; and a filtering method in which CNTs contained in a solution is uniformly deposited on a filter and is then transferred on a substrate.

In addition, in Japanese Patent No. 3665969 (claim 1 and paragraph 0013) titled "Method for Manufacturing CNT-Containing Film and CNT-Containing Coating", the following has been disclosed.

That is, in the method for manufacturing a CNT-containing coating film, after a first dispersion that contains at least CNTs and a solvent is applied to a surface of a substrate, the solvent of the first dispersion is removed so that CNTs form a three-dimensional net structure, and a second dispersion containing at least a resin and a solvent is applied thereto so as to infiltrate into the three-dimensional net structure of CNTs.

A film that is formed using the invention disclosed in the above Japanese Patent No. 3665969 can obtain superior conductivity and transparency even when the content of CNTs is low. In this preferable embodiment, the content of CNTs in the film is approximately 0.001 to 1 percent by weight. More preferably, the content of CNTs in the film is approximately 0.01 to 0.1 percent by weight, and as a result, superior transparency and low haze can both be obtained.

Next, in Japanese Unexamined Patent Application Publication No. 2006-298715 (paragraph 0006) titled "Manufacturing Method of CNT Thin Film, Manufacturing Method of Electronic Element, Manufacturing Method of Thin Film, Manufacturing Method of Structural Body, and Forming Method of Air Bubble", the following has been disclosed.

That is, it was found after a CNT dispersion containing a surfactant is prepared, when air is fed thereinto to form an air bubble, and this air bubble is deposited on a substrate, a CNT thin film having significantly superior uniformity and small thickness as compared to those of a CNT film obtained by a related method can be formed with high film thickness controllability.

The reason for this is believed that CNTs present in a film which forms a surface layer of this air bubble and which is formed from the CNT dispersion are deposited on the substrate to form the CNT film.

In addition, in "High-performance electronics using dense, perfectly aligned arrays of single-walled carbon" by S. J. Kang et al, Nature Nanotechnology, 2, pp 230 to 236 (2007) (FABRICATION OF NANOTUBE ARRAYS AND DEVICES), formation of a single-wall carbon nanotube (SWCNT) array by a chemical vapor deposition (CVD) method has been disclosed.

In addition, in "Large-area blown bubble films of aligned nanowires and carbon nanotubes" by G. Yu et al, Nature Nanotechnology, 2, pp. 372 to 377 and FIG. 1 (2007), a blown-bubble films (BBFs) method has been disclosed that includes three basic steps of: (1) preparing a polymer dispersion (epoxy dispersion) of nanowires or nanotubes having a stable and controlled concentration, (2) expanding the polymer dispersion at controlled pressure and expansion rate using a circular die so as to expand an air bubble, and (3) transferring the air bubble on a substrate or an open frame structure.

In addition, an LB method for forming a CNT thin film has been disclosed in "J. AM. CHEM. SOC." by Xiaolin Li et. al., 2007, 129, pp. 4890 to 4891; "Jpn. J. Appl. Phys." by Yeji KIM et. al., Vol. 42 (2003), pp, 7629-7634; and "Chemistry Letters", by Jun Matsui et. al., Vol. 35, No. 1 (2006), pp. 42 to 43.

SUMMARY OF THE INVENTION

In many cases, a material used for electronic devices is formed into a thin film on a substrate and is then used in an electric circuit, a storage element, or a light emission element.

When a general metal or oxide is used as the material, for example, uniform film formation can be performed by a vacuum dry process, such as a sputtering method, a deposition method, or a CVD method.

In addition, when a material called organic molecules, biomolecules, or a nanomaterial is used, film formation can be performed using a relatively simple apparatus by a liquid phase process, such as a plating method, a filtering method, a spray method, or a Langmuir Blodgett (LB) method.

Among those mentioned above, although the vacuum dry process is a method that is able to obtain a thin film having superior uniformity and crystallinity, since being generally used for an atomic level growth, this process is difficult to use for molecular materials or the like. Hence, although films of many molecular materials are preferably formed by a liquid phase process, in this case, it is necessary to dissolve or sufficiently disperse a molecular material in a solvent. In addition, even when an appropriate solvent is obtained, it is difficult to control the film thickness during film formation, and hence a uniform thin film is not easily obtained.

In addition, the plating method is a method that is frequently used in a secondary battery field (electrochemical field). Since this plating method is a method to obtain a thin film by condensing or depositing a material on an electrode substrate, conditions, such as a solvent and an electrode, are restricted. Hence, it may be said that this method is effectively applied only to a limited number of materials.

Although the filtering method and the spray method are each a simple method that may be applied to any materials in many cases, since the uniformity of a thin film to be formed is inferior, the methods described above have not been used for forming electronic devices.

The LB method is a method in which after amphipathic molecules are formed into a film on a liquid surface, a substrate is immersed thereinto to form a molecular film on a surface of the substrate. Many organic monomolecular layers formed by this method have been reported in academic fields; however, thin films obtained as described above have been rarely applied to electronic devices. The reasons for this are believed that, for example, the uniformity of an obtained thin film is degraded since two liquid phases are used and the application of amphipathic molecular films is limited. Furthermore, besides the reasons described above, for example, a thin film is difficult to form at a liquid-liquid interface using a nanomaterial such as CNTs, and a thin film is not stably adhered to a substrate when the substrate is immersed in a liquid different from a dispersion; hence, the LB method has been hardly used for electronic devices. In addition, since CNTs have inherently inferior dispersibility to form a LB film (monomolecular film on a liquid surface), film formation conditions are limited, and this limitation is also a practical problem.

The problems as described above become more serious when a thin film is formed using a nanoscale material, such as CNTs, having a one-dimensional nature. In particular, since the material as described above generally has inferior volatile and soluble properties, it is difficult to obtain a thin film having a uniform thickness distribution by the method described above.

In order to solve the problems as described above, as shown in FIGS. 16A1 to 16C, prior invention 1 of Japanese Patent Application No. 2008-39515 proposed by the inventor of the present invention has disclosed a technique in which a CNT thin film 20 of CNTs 22 is formed by growing an air bubble 10 having a soap bubble shape on a substrate 14.

In order to form this CNT thin film 20, a dispersion is first prepared in which the CNTs 22 are dispersed in an aqueous solution containing a surfactant.

Next, as shown by FIG. 16A1, after a liquid droplet of this dispersion is adhered to one end of a nozzle 12, air 16 is supplied from the other end of the nozzle 12 to expand the liquid droplet, so that the air bubble 10 made of a soap-bubble film containing the CNTs 22 is formed at one end of the nozzle 12.

In addition, as shown in FIGS. 16A2 and 16A3, after the air bubble 10 is brought into contact with the substrate 14 and is further expanded by supplying air, the air bubble 10 is finally ruptured as shown in FIG. 16A4, and drying is then performed, so that the thin film 20 of CNTs is allowed to remain on the substrate 14.

According to this manufacturing method, since the air bubble 10 made of a film containing the one-dimensional nanomaterial 22 is expanded on the surface of the substrate 14 to increase a contact area between the substrate 14 and the air bubble 10, the thin film 20 made of the one-dimensional nanomaterial 22 can be formed to have high orientation and superior transparency and conductivity. In addition, when the concentration of the one-dimensional nanomaterial in the dispersion and/or the contact area between the substrate and the film of the air bubble is controlled, the thickness of the thin film made of the one-dimensional nanomaterial can be controlled, and the transparency and the conductivity of the thin film can also be controlled. In addition, advantageously, the thin (ultrathin) film 20 of CNTs can be formed at room temperature in the air and can also be applied to any types of substrates 14 having various shapes and sizes.

However, in the CNT thin film 20 obtained by this method, since the air bubble 10 is grown (expanded) in a diameter direction from the position of the nozzle 12 as the center, radial orientation and thickness distribution are formed thereby; hence, when the whole CNT thin film 20 is observed, it may be difficult to say that the orientation and the film thickness have superior uniformity in one direction.

In addition, after the air bubble 10 is brought into contact with the surface of the substrate 14, the air 16 is supplied into the air bubble 10 through the nozzle 12 to grow the air bubble 10; hence, automatic operation is difficult to perform, and as the area of the substrate 14 is increased, the non-uniformity of thickness distribution of the CNT thin film 20 becomes disadvantageously apparent.

In order to solve the problems described above, in Japanese Patent Application No. 2008-145916, as shown in FIG. 17, the inventor of the present invention has proposed a technique for forming an ultrathin film using a dispersion film according to another prior invention 2.

With reference to FIG. 17, a thin-film manufacturing apparatus 24a according to an embodiment of this prior invention 2 will be described.

This thin-film manufacturing apparatus 24a is formed of a substrate support portion 6 holding a flat substrate 17 on which a thin film is formed, a dispersion-film holding ring 25 holding a dispersion film 21, a support portion 7 of this holding ring 25, and a dispersion storage portion 9 storing a CNT dispersion 8. In addition, the substrate support portion 6 and the ring support portion 7 are fixed to respective moving means 15a and 15b which are independently and linearly movable in the vertical direction and are formed to be independently and linearly moved in the vertical direction together with the respective moving means 15a and 15b.

In addition, in FIG. 17, in order to facilitate understanding of the state in which the dispersion film 21 is held, the dispersion holding ring 25 is shown by a perspective view when it is viewed from below. The substrate 17 is also shown by a perspective view when it is viewed from below. In addition, drying means for drying the dispersion film transferred on the substrate 17, rupturing means for rupturing the dispersion film 21 that remains inside the holding ring 25, and the like are not shown in the figure.

According to this prior invention 2, after the dispersion 8 containing CNTs dispersed therein is prepared by mixing CNTs and a surfactant and is then stored in the storage portion 9, the holding ring 25 is moved downward into the dispersion 8 and is then moved up therefrom to form the film 21 of the dispersion 8 inside the ring 25. Subsequently, while the film 21 is formed as described above, the substrate 17 is then reciprocatively slide-moved perpendicular to the dispersion film 21 so as to transfer the dispersion 8 on the surface of the substrate 17, and the dispersion 8 transferred on the surface of the substrate 17 so as to have a film shape is then dried, so that a CNT thin film is formed on the substrate 17.

Accordingly, since the dispersion film 21 is allowed to flow on the substrate 17 along the slide-moving direction thereof with respect to the dispersion film 21, CNTs contained in the dispersion 8 are likely to be oriented in one direction, and a highly oriented thin film having a uniform thickness can be formed. Hence, the film thus obtained may be used, for example, for a transparent conductive film, a substrate in-plane wire, and a linear polarizer, each having anisotropic electrical and optical properties in the oriented direction, and in addition, electronic devices, such as a thin film transistor, incorporating those described above may also be formed. In addition, when the number of slide movements is controlled, the thickness of the thin film can be controlled, and the conductivity, transparency, and the like can also be controlled. Furthermore, even by a material, such as CNTs, having inferior volatile and soluble properties, a thin film can be formed at room temperature in the air with good operability; this technique described above may be expected to be applied to other various materials as well as CNTs; a film may be formed on the substrate 17 having a large area; a film may be formed without selecting a particular material for the substrate; and degradation in material may not occur during film formation.

However, it was found that the method according to this prior invention 2 also still has problems to be solved. For example, the dispersion film 21 itself is unstable as compared to a solution or the like; the size of the substrate 17 is limited; irregularities of a thin film are formed at a peripheral portion of the substrate 17; the orientation of a thin-film material is not sufficiently controlled; and a process throughput is not significantly high.

Because of the problems as described above, various properties, such as electrical conductivity, optical properties, and uniformity, of the thin film thus formed may not be good enough in some cases to be applied to displays, solar cells, and the like.

The reasons these problems occur are believed that, in particular, when the substrate 17 is slide-moved, the dispersion film 21 is warped in a gravity direction and the shape of the ring 25 reaches its limitation, as shown in FIG. 18A and 18B. For example, since the dispersion film 21 formed inside the ring 25 hangs down by its own weight and is warped since a tensile force is concentrated to a central portion C, the non-uniformity of the thickness of the dispersion film tends to increase from the central portion C to a peripheral portion P at the outer circumference side (the thickness irregularities are small at the central portion but are liable to increase at the peripheral side).

In addition, as shown in FIG. 18C, the dispersion film 21 tends to be strongly pulled by the substrate 17 at the central portion as compared to at the peripheral portion (inner circumference side of the ring 25) due to a friction force generated when the substrate 17 is slide-moved. In addition, since the size of the substrate 17 is limited by the shape of the ring 25, and the shape symmetry of the substrate 17 and that of the dispersion film 21 are different from each other, irregularities may arise.

It has been believed that since those problems described above cause instability of the dispersion film 21, the CNT orientation of the thin film formed on the substrate 17 is degraded, and the throughput is decreased.

The present invention has been conceived in consideration of the problems described above, and it is desirable to provide an easily operable method and apparatus for manufacturing a thin film, the method and apparatus being capable of further improving the orientation of a thin-film forming material, the uniformity and controllability of the thickness of a thin film, and the stability of film formation; and a method for manufacturing an electronic device using a thin film manufactured by the method and apparatus described above.

That is, according to an embodiment of the present invention, there is provided a method for manufacturing a thin film, including: a first step of mixing a thin-film forming material and a surfactant to prepare a dispersion in which the thin-film forming material is dispersed; a second step of forming a dispersion film from the dispersion at an inner circumference side of ring-shaped holding means; a third step of relatively moving a cylindrical supporter and the dispersion film while being in contact with each other so that the dispersion is transferred on a surface of the supporter to have a film shape, the supporter being disposed between a central portion of an inside space of the holding means and an outer circumference thereof and along an inner circumference of the holding means; and a fourth step of drying the dispersion having a film shape formed on the surface of the supporter to form the thin film.

In addition, according to an embodiment of the present invention, there is provided an apparatus for manufacturing a thin film, which is used for the method for manufacturing a thin film described above, including: dispersion storage means for storing a dispersion containing the thin-film forming material and the surfactant; ring-shaped dispersion-film holding means for holding a film formed from the dispersion; moving means for relatively moving the dispersion film and the supporter while being in contact with each other; and drying means for drying a dispersion having a film shape transferred on the surface of the cylindrical supporter.

In addition, according to an embodiment of the present invention, there is provided a method for manufacturing an electronic device, including the steps of: mixing a thin-film forming material and a surfactant to prepare a dispersion in which the thin-film forming material is dispersed; forming a dispersion film from the dispersion at an inner circumference side of ring-shaped holding means; relatively moving a cylindrical supporter and the dispersion film while being in contact with each other so that the dispersion is transferred on a surface of the supporter to have a film shape, the supporter being disposed between a central portion of an inside space of the holding means and an outer circumference thereof and along an inner circumference of the holding means; and drying the dispersion having a film shape formed on the surface of the supporter to form the thin film.

According to the present invention, the cylindrical supporter, which is disposed between the central portion of the inside space of the holding means and the outer circumference thereof and along the inner circumference of the holding means, and the dispersion film are relatively moved while being in contact with each other, and the dispersion is transferred on the surface of the supporter to have a film shape. Accordingly, the supporter is relatively moved along the inner circumference of the holding means (other than the central portion thereof) while being relatively uniformly in contact with the dispersion film, and while the dispersion film is allowed to flow on the substrate along this relative moving direction, the thin-film forming material in the dispersion is placed in a relatively uniform state without being influences by warping, tensile-force concentration, and friction force and is likely to be uniformly oriented on the supporter in one direction along the relative moving direction without generating irregularities. As a result, a highly oriented thin film having a uniform thickness can be formed; the thin film thus obtained can be applied to a transparent electrode, an substrate in-plane wire (conductive path), a linear polarizer, and the like, each having anisotropic electrical and optical properties (such as conductivity and/or optical transparency) in the orientation direction; and electronic devices incorporating those described above can be obtained.

In addition, when the number of the relative movements is controlled, the thickness of the thin film can be controlled, and the conductivity, transparency, and the like thereof can also be controlled.

Furthermore, the thin film can be formed at room temperature in the air with good operability, and by increasing a film-formation effective area (or the size) of the dispersion film held by the holding means, a film can be formed on the supporter having a large surface area without restricting the size thereof by the shape of the holding means. In addition, film formation can be performed without selecting a specific material as a supporter material, and further, the material is not likely to be degraded during film formation.

BRIEF DESCRIPTION OF THE DRAWINGS

FIGS. 1A to 1C are schematic cross-sectional views sequentially showing steps of manufacturing a CNT thin film according to a first embodiment of the present invention;

FIGS. 16A1 to 16C are views showing a process for forming a thin film according to one prior invention, FIGS. 16A1 to 16A3 being front views, FIG. 16A4 including a front and a plan view, FIG. 16B being a perspective view, and FIG. 16C being a detailed cross-sectional view;

DESCRIPTION OF THE PREFERRED EMBODIMENTS

Figure 2A:
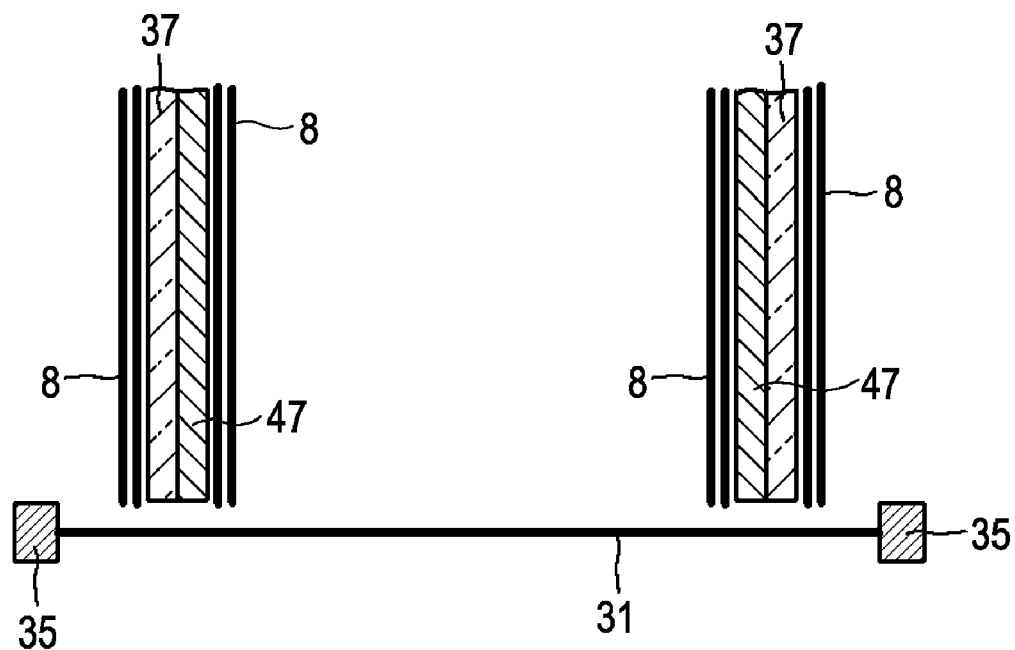
FIGS. 2A and 2B are cross-sectional views showing steps of manufacturing the CNT thin film.

According to the present invention, in order to improve the orientation of the forming material, it is preferable that the holding means be disposed in the horizontal direction, the dispersion film be formed in the horizontal direction, and the supporter be reciprocatively moved relatively in the vertical direction.

In order to more evenly bring the supporter into contact with the dispersion film, it is preferable that the outer circumference of the supporter and the outer circumference of the dispersion film have similar figures and each have a line-symmetric shape, in particular, a circular shape.

In this case, in order to form a more uniform thin film, the center of the supporter and the center of the dispersion film are preferably coaxial since the distance between the outer circumference of the supporter and the outer circumference of the dispersion film can be maintained approximately constant.

In addition, in order to hold the supporter to have a cylindrical shape (for example, a flat shape is elastically deformed into a cylindrical shape), the supporter is preferably fixed to an outer surface of a cylindrical holding member.

In addition, without using a cylindrical holding member, the supporter itself may be formed into a cylindrical shape and may be relatively moved.

In addition, in order to further improve the properties, such as conductivity and transparency, of the thin film, after the drying described above is performed, the supporter is preferably washed with purified water or the like so as to remove unnecessary residues while the orientation of the thin film is maintained.

In addition, in order to control the conductivity, transparency, and the like, of the thin film, at least the second step to the fourth step are repeatedly performed, so that the thickness of the thin film can be controlled.

In addition, in order to form the thin film having high orientation from the forming material on the supporter, the supporter is preferably moved relatively with respect to the dispersion film in a direction that intersects therewith, and in particular, in a direction orthogonal thereto.

In addition, a transparent high molecular weight substrate is preferably used as the supporter. When a flexible high molecular weight substrate as described above is used, and when a thin film of the one-dimensional nanomaterial or the like is formed thereon as an electrode, a wire, or a conductive path, a flexible (bendable or soft) electrode body, a wire body, or a conductive path body can be manufactured.

In addition, the forming material is preferably a one-dimensional nanomaterial, such as carbon nanotubes (CNTs).

Furthermore, the electronic device according to an embodiment of the present invention may include a liquid crystal device, an electroluminescent device, an electrochromic device, a field effect transistor, a touch panel, and a solar cell.

Next, preferred embodiments of the present invention will be described in detail with reference to the drawings.

First Embodiment

Figure 5:
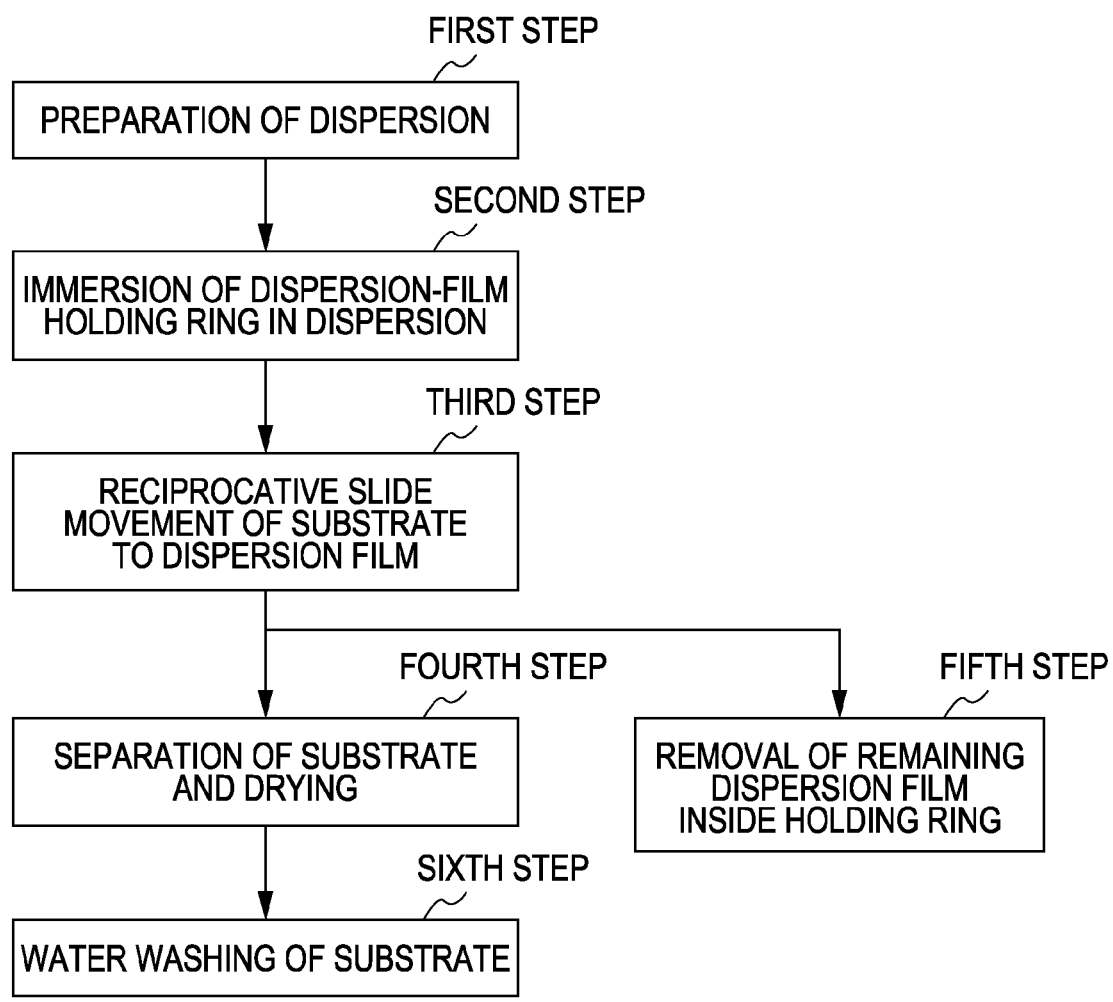
FIG. 5 is a flowchart showing steps of manufacturing the CNT thin film.
Figure 6:
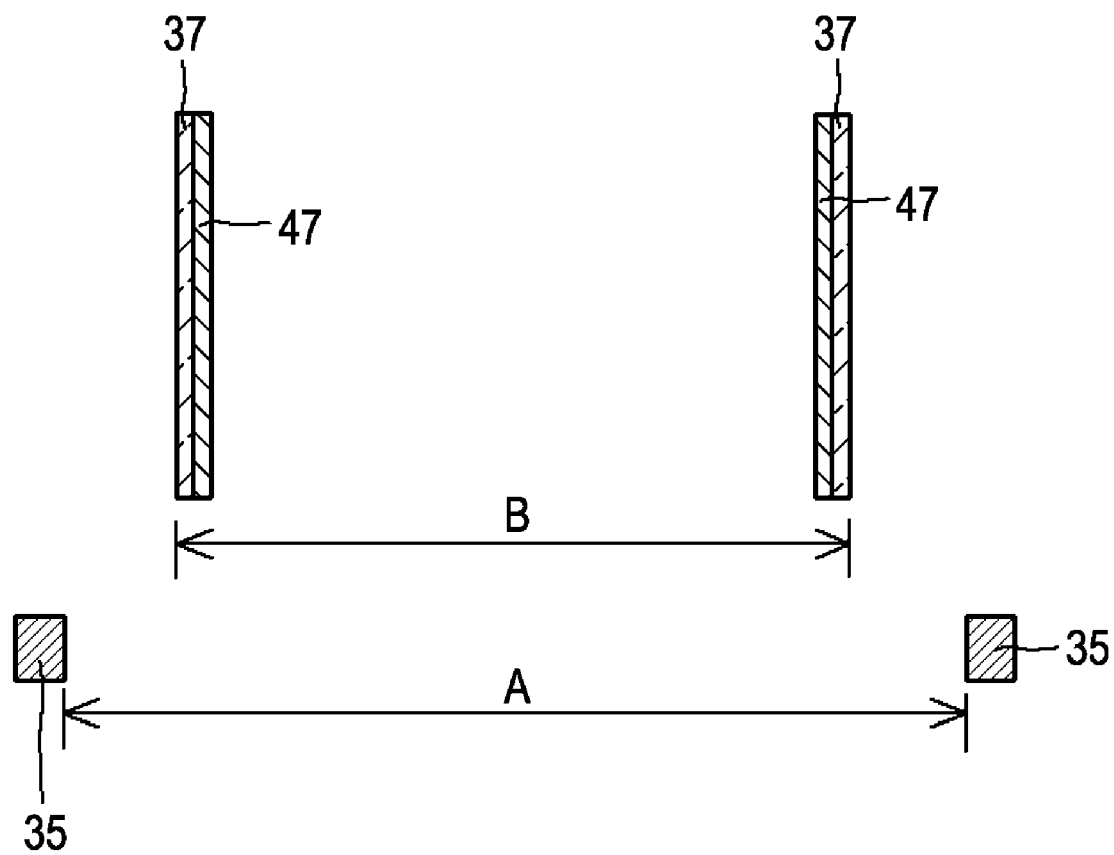
FIG. 6 is a cross-sectional view illustrating the relationship in size between a substrate and a dispersion-film holding ring according to the first embodiment of the present invention.
Figure 7:
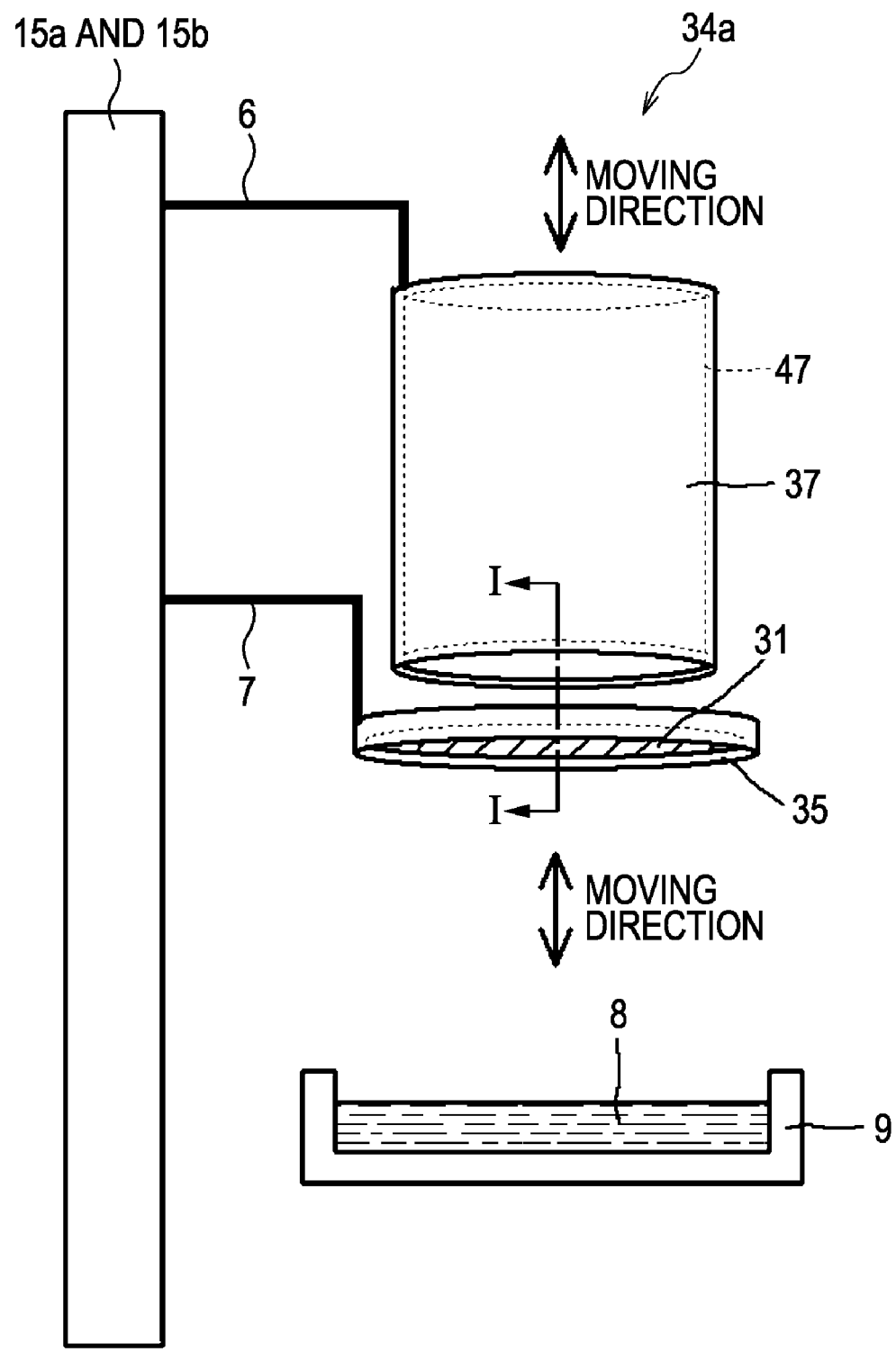
FIG. 7 is a schematic front view showing a thin-film manufacturing apparatus according to the first embodiment of the present invention.

FIGS. 1A to 7 are views illustrating a first embodiment of the present invention (FIGS. 1A, 1B, and 1C are views of operation steps each shown by a cross-section along the line I-I of FIG. 7).

First, with reference to FIG. 7, a thin-film manufacturing apparatus 34a according to this embodiment will be described.

This thin-film manufacturing apparatus 34a includes a substrate holding member (cylindrical holding means) 47 holding and fixing a substrate (transparent high molecular weight substrate functioning as a supporter) 37 in the form of a cylinder, a substrate support portion 6 connecting the substrate holding member 47 to a supporter moving device 15a, a dispersion-film holding ring (dispersion-film holding means) 35 holding a dispersion film (film formed from a CNT dispersion) 31, a support portion 7 of this holding ring 35, and a CNT dispersion storage portion (dispersion storage means) 9 storing a CNT dispersion 8.

In addition, the substrate support portion 6 and the ring support portion 7 are fixed to the moving device 15a and 15b, respectively, which are independently movable along the vertical direction, and are configured to be moved independently in the vertical direction together with the respective moving devices 15a and 15b.

In order to facilitate understanding of the state of holding the dispersion film 31, the dispersion-film holding ring 35 is shown by a perspective view of FIG. 7 when it is viewed from below. The substrate 37 and the holding member 47 are also shown by a perspective view when it is viewed from below. In addition, drying means for drying a dispersion film transferred on the substrate 37, a rupturing device configured to rupture a dispersion film 21 remaining inside the holding ring 35, and the like are not shown in the figure.

Next, a method for manufacturing a thin film 18 on the surface of the substrate 37 using this thin-film manufacturing apparatus 34a will be described.

This manufacturing process is shown by a flowchart of FIG. 5, and major steps thereof are shown by cross-sectional views of FIGS. 1A to 2B. First, the CNT dispersion 8 in which CNTs (thin-film forming material or one-dimensional nanomaterial) 22 are dispersed is prepared by mixing the CNTs 22 and a surfactant and is then stored in the CNT dispersion storage portion 9 (first step).

Next, the dispersion-film holding ring 35 is moved downward to be immersed in the CNT dispersion 8 in the CNT dispersion storage portion 9 and is then moved upward, so that the dispersion film 31 (soap film) made from the CNT dispersion 8 is formed inside the dispersion-film holding ring 35 as shown in FIG. 1A (second step). The dispersion film 31 is maintained to have a film shape inside the ring 35 by its own surface tension.

Next, as shown in FIG. 1B, the substrate holding member 47 is moved downward to the dispersion film 31 that is formed inside the dispersion-film holding ring 35 and is further relatively moved downward (slide movement) perpendicular thereto while the substrate 37 fixed to the outside of the substrate holding member 47 is in contact with the dispersion film 31. Furthermore, as shown in FIG. 1C, the substrate holding member 47 is then moved upward (slide movement). That is, in other words, the substrate 37 is reciprocatively moved in the vertical direction relative to the dispersion film 31, so that the CNT dispersion 8 is transferred from the dispersion film 31 formed inside the holding ring 35 on the surface of the substrate 37 so as to have a film shape (third step).

As one example, the reciprocative slide movement may be performed approximately 10 times, and in addition, the substrate 37 may be moved up and down while the holding ring 35 is fixed at the position shown in FIG. 7.

Figure 2B:
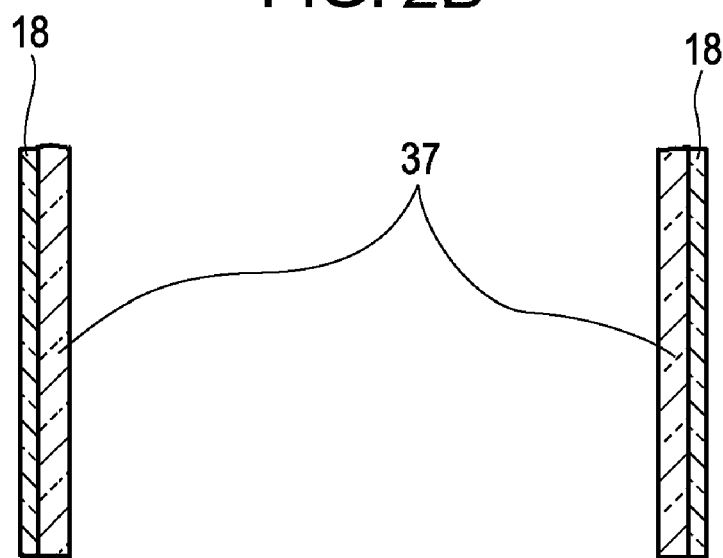
Figure 3:
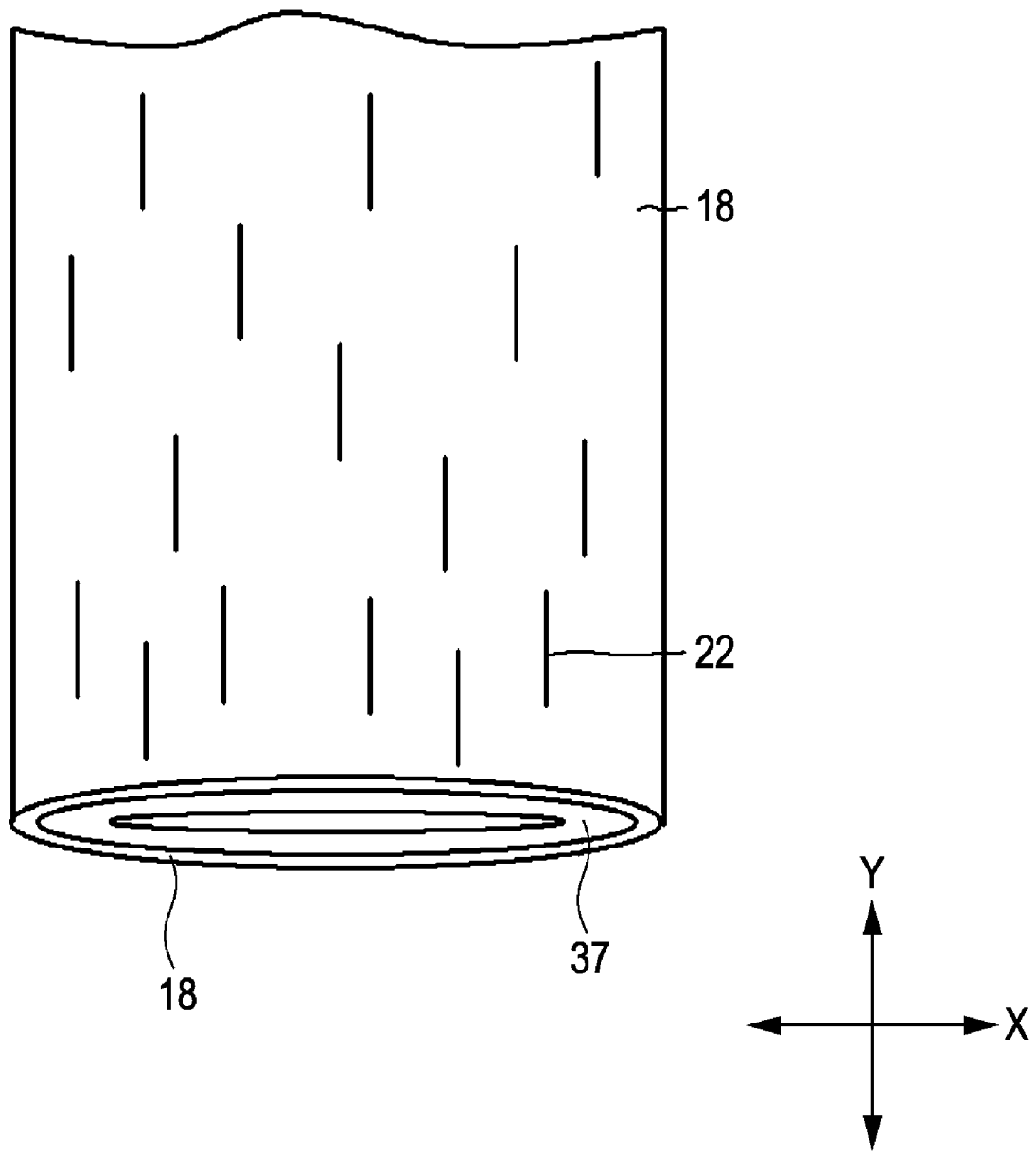
FIG. 3 is a perspective view of the CNT thin film when viewed from below.

As shown in FIG. 2A, after the CNT dispersion 8 is transferred on the surface of the substrate 37 so as to form a film shape having a lamination structure, and the substrate 37 is separated from the dispersion film 31, the CNT dispersion 8 having a film shape formed on the surface of the substrate 37 is dried by the drying means, such as a hot-air blower, to form the thin film 18 in which the CNTs 22 are oriented in the slide moving direction as shown in FIG. 2B (fourth step). FIG. 2B shows the state in which the substrate 37 and the thin film formed thereon are separated from the holding member 47. FIG. 3 is a perspective view showing the orientation state of the CNTs 22, and the CNT film thus oriented is spread out into a sheet and is used for manufacturing an electronic device.

Next, the dispersion film remaining inside the dispersion-film holding ring 35 is removed by rupturing thereof using an air blow or the like (fifth step). Subsequently this holding ring 35 is again used in the above second step.

In addition, the substrate 37 is washed with purified water, so that unnecessary residues, such as remaining moisture, are removed (sixth step). As a result, the CNT thin film 18 containing no residues is formed on the substrate 37.

Furthermore, the above second to fourth steps (further including the fifth and sixth steps) are performed at least one time or are preferably repeated 2 to 6 times, so that the thickness of the thin film 18 finally formed on the substrate 37 can be controlled.

As a material for the above high molecular weight substrate 37, poly(ethylene terephthalate) (PET), poly(ethylene naphthalate) (PEN), polycarbonate (PC), poly(ether sulfone) (PES), and derivatives thereof may be used.

For example, in accordance with the purpose, application, and usage environment of the high molecular weight substrate 37 on which the thin film 18 made of CNTs is formed, a material for the substrate 37 may be appropriately selected in consideration of optical, electrical, and mechanical properties.

Next, the CNT dispersion 8 made of the CNTs 22 and a surfactant will be described.

As the CNTs 22, a product formed, for example, by arc discharge, laser abrasion, or a chemical vapor deposition (CVD) method, may be used. When the CNTs 22 thus formed are processed, for example, by a high-temperature treatment, an acid treatment using sulfuric acid, hydrochloric acid, nitric acid, a hydrogen peroxide solution, or the like, or an alkaline treatment using sodium hydroxide or the like, impurities, such as amorphous carbon, can be removed, so that refined CNTs 22 having a high purity can be used.

In addition, as the CNTs 22, for example, single wall CNTs (SWCNTs) having a single layer structure, double wall CNTs (DWCNTs) having a two-layer structure, or multiwall CNTs (MWCNTs) having a multi-layer structure may also be used. In addition, although the length of each CNT 22 is not particularly limited, in order to obtain superior dispersibility, for example, a length of approximately 1 μm or less is preferable.

Next, as the surfactant, for example, an anion surfactant, a cation surfactant, an amphoteric surfactant, and a non-ionic surfactant may be used.

In addition, as the anion surfactant, for example, $C_8H_{17}SO_3^-Na^+$, $C_{10}H_{21}SO_3^-Na^+$, $C_{12}H_{25}SO_3^-Na^+$, $C_{14}H_{29}SO_3^-Na^+$, $C_{16}H_{33}SO_3^-Na^+$, $C_8H_{17}SO_4^-Na^+$, $C_{10}H_{21}SO_4^-Na^+$, $C_{11}H_{23}SO_4^-Na^-$, $C_{12}H_{25}SO_4^-Na^+$, $C_{12}H_{25}SO_4^-Li^+$, $C_{12}H_{25}SO_4^-K^+$, $(C_{12}H_{25}SO_4^-)_2Ca_2^+$, $C_{12}H_{25}SO_4^-N(CH_3)_4^+$, $C_{12}H_{25}SO_4^-N(C_2H_5)_4^+$, $C_{12}H_{25}SO_4^-N(C_4H_9)_4^+$, $C_{13}H_{27}SO_4^-Na^+$, $C_{14}H_{29}SO_4^-Na^+$, $C_{15}H_{31}SO_4^-Na^+$, $C_{16}H_{33}SO_4^-Na^+$, $C_{12}H_{25}CH(SO_4^-Na^+)$ $C_3H_7$, $C_{10}H_{21}CH(SO_4^-Na^+)C_5H_{11}$, $C_{13}H_{27}CH(CH_3)$ $CH_2SO_4^-Na^+$, $C_{12}H_{25}CH(C_2H_5)CH_2SO_4^-Na^+$, $C_{11}H_{23}CH$ $(C_3H_7)CH_2SO_4^-Na^+$, $C_{10}H_{21}CH(C_4H_9)CH_2SO_4^-Na$, $C_{12}H_{25}OC_2H_4SO_4^-Na^+$, $C_{12}H_{25}(OC_2H_4)_2SO_4^-Na^+$, $C_{12}H_{25}(OC_2H_4)_4SO_4^-Na^+$, $C_8H_{17}OOC$ $(CH_2)_2SO_4^-Na^+$, $C_{10}H_{21}OOC(CH_2)_2SO_3^-Na^+$, $C_{12}H_{25}OOC(CH_2)_2SO_3^-Na^+$, $C_{14}H_{29}OOC(CH_2)_2SO_3^-Na^+$, p-n-$C_8H_{17}C_6H_4SO_3^-Na^+$, p-n-$C_{10}H_{21}C_6H_4SO_3^-Na^+$, p-n-$C_{12}H_{25}C_6H_4SO_3^-Na^+$, $C_7F_{15}COO^-K^+$, $C_7F_{15}COO^-Na^+$, $(CF_3)CF(CF_2)_4COO^-Na^+$, or n-$C_8F_{17}SO_3^-Li^+$ may be used.

As the cation surfactant, for example, $C_8H_{17}N(CH_3)_3^+Br^-$, $C_{10}H_{21}N(CH_3)_3^+Br^-$, $C_{12}H_{25}N(CH_3)_3^+Br^-$, $C_{14}H_{29}N(CH_3)_3^+Br^-$, $C_{16}H_{33}N(CH_3)_3^+Br^-$, $C_{12}H_{25}Pyr^+Br^-$, $C_{12}H_{25}Pyr^+Cl^-$, $C_{14}H_{29}Pyr^+Cl^-$, $C_{16}H_{33}Pyr^+Cl^-$, $C_{12}H_{25}N^+(C_2H_5)(CH_3)_2Br^-$, $C_{12}H_{25}N^+(C_8H_{17})(CH_3)_2Br^-$, $C_{14}H_{29}N^+(C_2H_5)_3Br^-$, or $C_{14}H_{29}N^+(C_4H_9)_3Br^-$ may be used.

In addition, as the amphoteric surfactant, for example, $C_8H_{27}N^+(CH_3)_2CH_2COO$, $C_{10}H_{21}N^+(CH_3)_2CH_2COO$, $C_{12}H_{25}N^+(CH_3)_2CH_2COO$, $C_{14}H_{29}N^-(CH_3)_2CH_2COO^-$, $C_{16}H_{33}N^+(CH_3)_2CH_2COO^-$, $C_{10}H_{21}CH(Pyr^+)COO^-$, or $C_{14}H_{29}CH(Pyr^+)COO^-$ may be used.

In addition, as the non-ionic surfactant, for example, $C_8H_{27}CHOHCH_2OH$, $C_{12}H_{25}CHOHCH_2OH,C_8H_{17}(OC_2H_4)_3OH$, $C_{10}H_{21}(OC_2H_4)_4OH$, $C_{11}H_{23}(OC_2H_4)_8OH$, $C_{12}H_{25}(OC_2H_4)_2OH$, $C_{12}H_{25}(OC_2H_4)_4OH$, $C_{12}H_{25}(OC_2H_4)_6OH$, $C_{12}H_{25}(OC_2H_4)_8OH$, $C_{13}H_{27}(OC_2H_4)_8OH$, $C_{14}H_{29}(OC_2H_4)_8OH$, $C_{15}H_{31}(OC_2H_4)_8OH$, p-t-$C_8H_{17}C_6H_4O(C_2H_4O)_2H$, p-t-$C_8H_{17}C_6H_4O(C_2H_4O)_8H$, n-octyl-β-D-glucoside, or n-decyl-β-D-glucoside may be used.

Among the surfactants mentioned above, p-n-$C_{12}H_{25}C_6H_4SO_3^-Na^+$ (SDBS: sodium dodecyl benzene sulfonate), $CH_3(CH_2)_{11}SO_4^-Na^+$ (SDS: sodium dodecyl sulfate), which are anion surfactants, are preferably used since the CNTs 22 are favorably dispersed; however, this embodiment is not limited thereto. In addition, at least two of the above surfactants may be used in combination.

In addition, when the CNT thin film 18 has a thickness of 100 μm or less, high transparency can be obtained; hence, the CNT thin film 18 may be used for a transparent electrode that is desired to have superior transparency.

As described above, when the substrate 37 and the dispersion film 31 that contains the CNTs 22 and the like and that is formed in advance are relatively slide-moved, the CNT thin film 18 is semi-automatically formed to have a uniform thickness.

In this method, when the dispersion film 31 and the substrate 37 are relatively slide-moved while being in contact with each other, the CNT thin film 18 oriented in a relative slide moving direction of the dispersion film 31 is advantageously formed to have a very small thickness, and this advantage is significantly different from a related LB method.

That is, as described above, the electrical and optical properties of a thin film obtained by an LB method are considerably inferior to those of CNTs itself, and the reasons for this are believed that besides the problems of an LB method described above, a thin film is difficult to form at a liquid-liquid interface using a one-dimensional nanomaterial, such as the CNTs 22, and is not stably adhered to a substrate by immersion thereof into a liquid different from a dispersion. In addition, when it is intended to form an LB film (monomolecular film on a liquid surface) of the CNTs 22, since the dispersibility thereof is inherently inferior, in practice, the film formation conditions are disadvantageously limited.

On the other hand, according to this embodiment, since the dispersion film 31 and the substrate 37 are relatively slide-moved using the CNT dispersion 8 that forms no liquid-liquid interface, the CNT thin film 18 that has a uniform thickness and that is highly oriented along the slide moving direction can be easily, reliably, and stably formed on the substrate 37, and hence a substrate in-plane wire (conductive path), a linear polarizer, and the like, having anisotropic electrical and optical properties in the orientation direction can be formed.

Figure 4A:
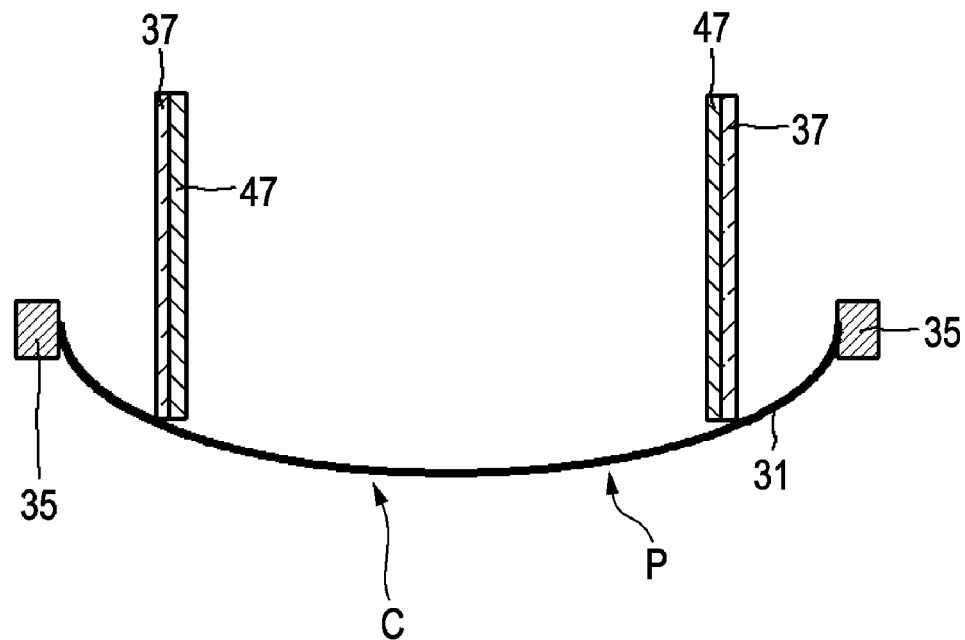
FIGS. 4A and 4B are cross-sectional views illustrating the state of the CNT thin film during manufacturing.
Figure 4B:
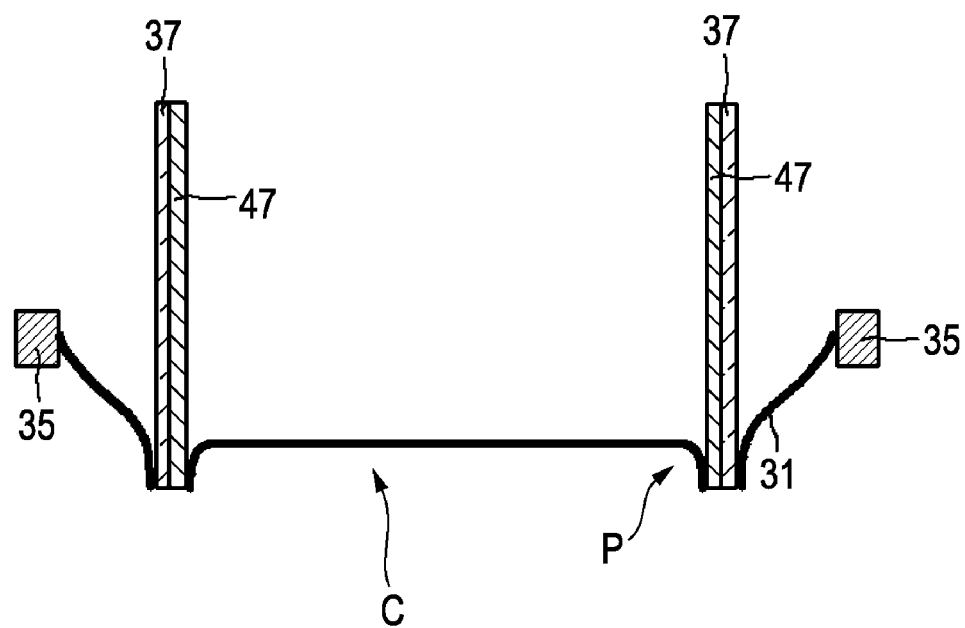

In addition, after the cylindrical substrate 37 held by the substrate holding member 47 and the dispersion film 31 are brought into contact with each other, as shown in FIG. 4A, and are then relatively slide-moved as shown in FIG. 4B, a central portion C of the dispersion film 31 is not in contact with the substrate 37, and a peripheral portion P is uniformly in contact therewith all along the circumference direction; hence, the dispersion 8 can be transferred on the surface of the substrate 37 without generating irregularities, so that the CNT thin film 18 can be formed to have a uniform thickness.

In addition, as shown in FIG. 6, in order to sufficiently obtain the above-described effect, the ratio of an inside diameter A of the dispersion-film holding ring 35 to an outside diameter B of the substrate 37 (or the ring 35) fixed on the outside surface of the substrate holding member 47 has a predetermined preferable relationship, and A: B is preferably set to 1: 0.8 to 0.99. However, the inside diameter of the ring 35 may be variously changed, and in accordance with this inside diameter, the above ratio A/B may be appropriately determined. When this ratio is excessively large, since vibration of the ring 35 during operation adversely influences the dispersion film, uniform film formation may not be performed, and when this ratio is excessively small, influences of warping and friction of the dispersion film described above are generated, so that uniform film formation may not be performed in some cases.

The curvature radius of the substrate 37 and that of the substrate holding member 47 may be set to 10 mm or more (diameter of 20 mm or more), and the circumferential length of the dispersion film 31 and that of the ring 35 may be set to 30 mm or more.

According to this embodiment, since the substrate 37 coaxial with the dispersion film 31 (ring 35) and having a similar cylindrical shape to that thereof is slide-moved, the influence of warping of the dispersion film 31 in a gravity direction can be minimized, and film formation can be performed while the size (effective region) of the dispersion film 31 is maximally used.

By using the method described above, an excessive area of the dispersion film 31 can be reduced to improve the stability, and furthermore, warping and irregularities of the dispersion film 31 are suppressed by improving the symmetry between the dispersion film 31 and the substrate 37 during film formation, so that a thin film having a uniform thickness can be formed with high throughput.

In addition, the thickness of the thin film 18 is controlled by controlling the number of reciprocative slide movements, so that the conductivity and/or the transparency of the thin film 18 can be easily controlled.

Furthermore, since the ultrathin film 18 of a monomolecular layer level can be formed, the transparency is superior. Alternatively, lamination and densification of a thin film can be easily performed.

In addition, without selecting conditions, such as the material for and the size of the substrate 37, film formation can be performed; the material is hardly degraded during film formation, and film formation can be performed at room temperature in the air; the structure of the apparatus is simple and can be easily automated; and further the surface area of the thin film can be easily increased.

The thin film 18 according to this embodiment has a low surface resistance, a high optical transmittance, and superior electrical and optical properties and can be preferably used as transparent electrode of a liquid crystal device, an electroluminescent device, an electrochromic device, and a solar cell.

In addition, the thin film 18 may also be used to form a conductive path, a field effect transistor, or a touch panel.

Second Embodiment

Figure 8:
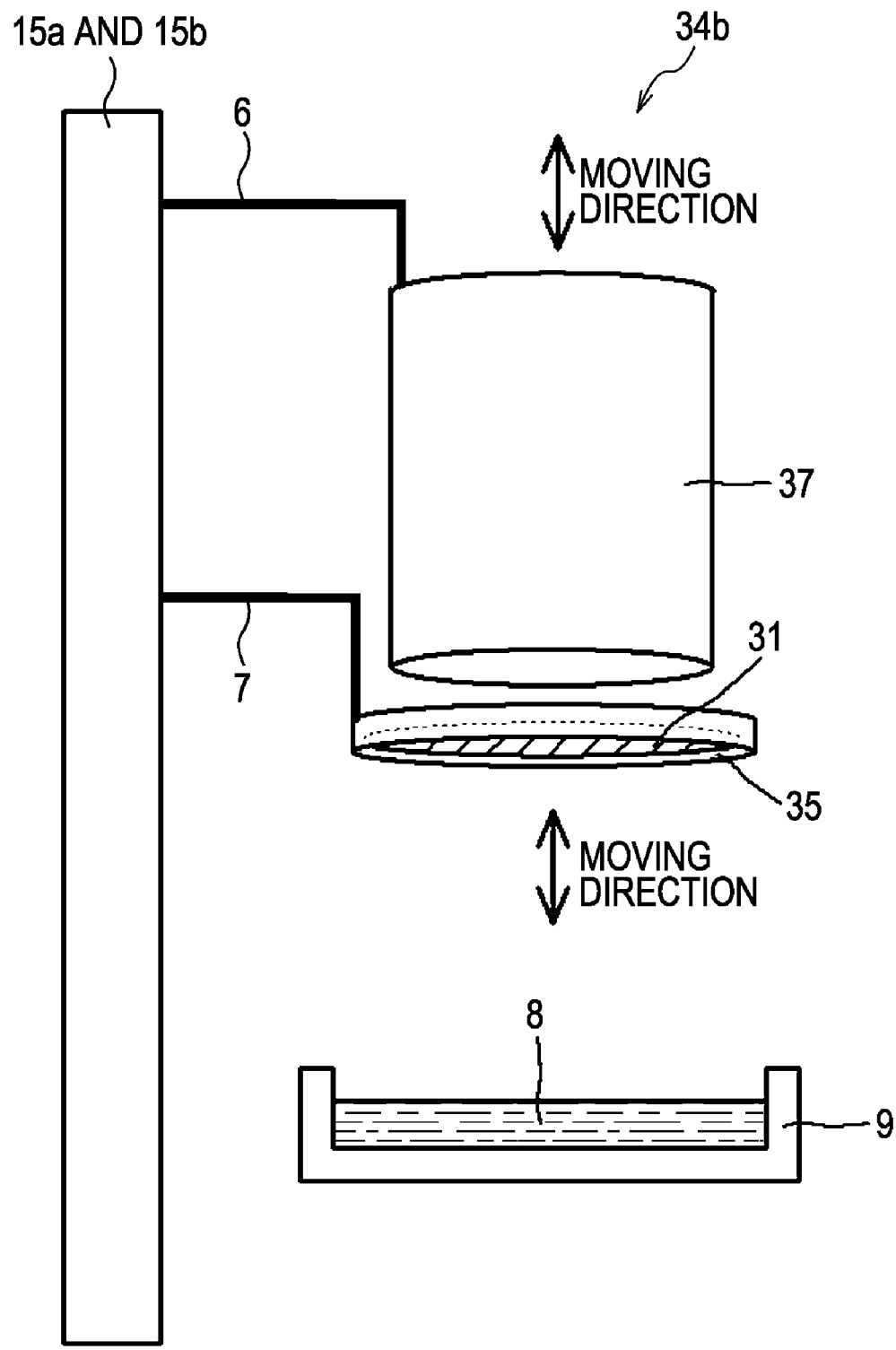
FIG. 8 is a schematic front view showing a thin-film manufacturing apparatus according to a second embodiment of the present invention.

FIG. 8 is a view showing a second embodiment of the present invention.

A thin film-formation apparatus 34*b* according to this embodiment is the same as that of the first embodiment except that the substrate 37 is directly held by the substrate support portion 6.

According to this embodiment, the substrate holding member 47 holding the substrate 37 can be omitted, so that the structure of the apparatus 34b can be simplified.

In addition, in this embodiment, the same operation and effect as that of the above first embodiment can also be obtained.

Third Embodiment

Figure 9A:
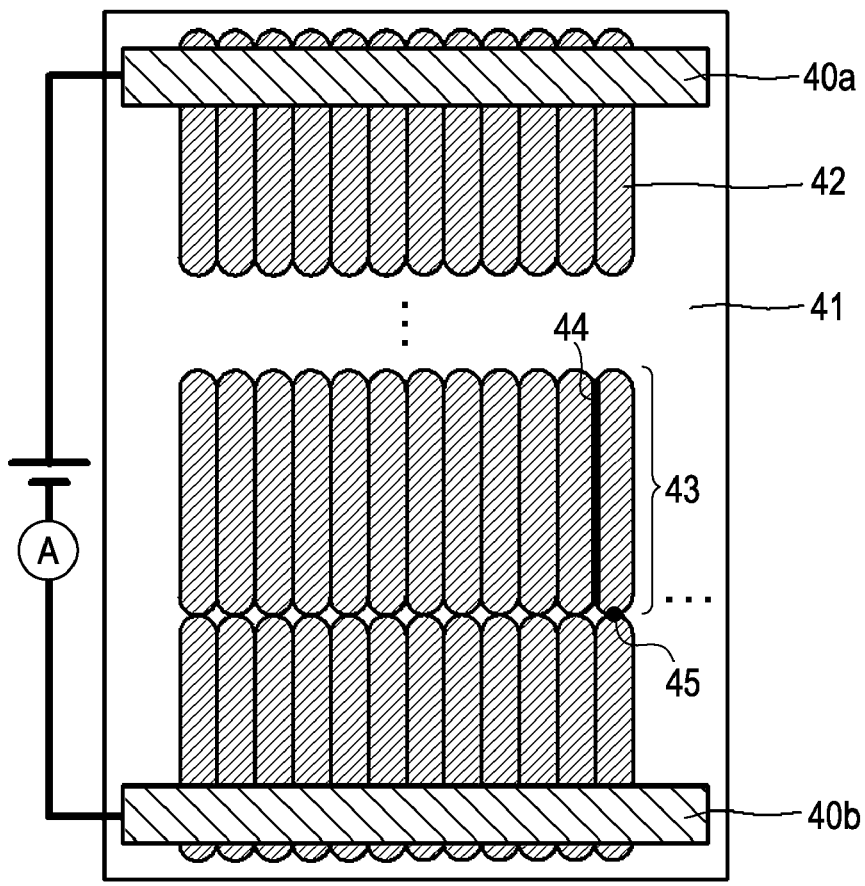
FIG. 9A is a schematic plan view illustrating conductive properties of a CNT thin film according to a third embodiment of the present invention.
Figure 9B:
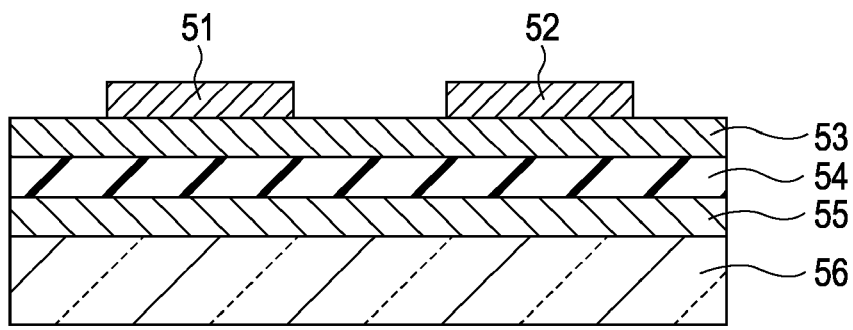
FIG. 9B is a schematic cross-sectional view showing one application example to an electronic device.

FIGS. 9A and 9B are views showing a third embodiment of the present invention in which a CNT thin film is applied to an electronic device; FIG. 9A is a schematic plan view illustrating conductive properties of the CNT thin film; and FIG. 9B is a cross-sectional view of a back-gate field effect transistor using the CNT thin film.

FIG. 9A is a view illustrating conductive properties of a highly-dense and oriented film of CNTs 42 (corresponding to the above CNTs 22) in an axis direction, which are obtained when many CTNs 42 are closely in contact with each other in a two-dimensional manner on a substrate 41 (corresponding to the above substrate 37) to form a connected state.

The resistance of this CNT oriented film can be estimated from the resistance (line resistance) of one CNT 42 in the length direction, the contact resistance between CNTs, the length of one CNT, the length and width of the CNT oriented film, and other factors.

In addition, the optical transparency of the CNT oriented film can be estimated from the film thickness and the optical absorption coefficient of CNT, and for example, when a line resistance 43 of the CNT 42 in the axis direction is set to 2,400 $\Omega/\mu m$, a contact resistance 44 between wall surfaces of the CNTs 42 is set to $50,000\Omega$, and a contact resistance 45 between front portions of the CNTs 42 is set to $50,000\Omega$ (other factors are omitted), the optical transmittance of a CNT thin film formed of laminated two molecular layers is 96% at a wavelength of 550 nm, and the resistance between electrode 40a and 40b is approximately 140 $\Omega$.

FIG. 9B is a view showing a schematic structure of a back-gate field effect transistor (FET) using the CNT film for a channel 53. For example, a gate electrode 55 is laminated on a substrate 56 (corresponding to the above substrate 41), a gate insulating layer 54 formed, for example, of a poly(methyl methacrylate) (PMMA) or a polyimide vanish is laminated on the gate electrode 55, the channel 53 is laminated on this insulating layer 54, and on this channel 53, a source electrode 51 and a drain electrode 52 are laminated.

In the structure as described above, when the substrate 56, the gate electrode 55, the insulating layer 54, the channel 53, the source electrode 51, and the drain electrode 52 are each formed from a transparent layer, an optically transparent FET can be realized.

In addition, in the above FET, when the gate electrode 55, the source electrode 51, and the drain electrode 52 are formed of metal CNTs, the channel 53 may be formed of semiconductive CNTs.

When these CNTs are formed by the method according to the above first or the second embodiment to have high orientation and a uniform thickness, necessary conductivity or transparency can be obtained.

In addition, besides the back-gate field effect transistor described above, an FET using the CNT thin film may also have a top-gate structure.

Fourth Embodiment

Figure 10A:
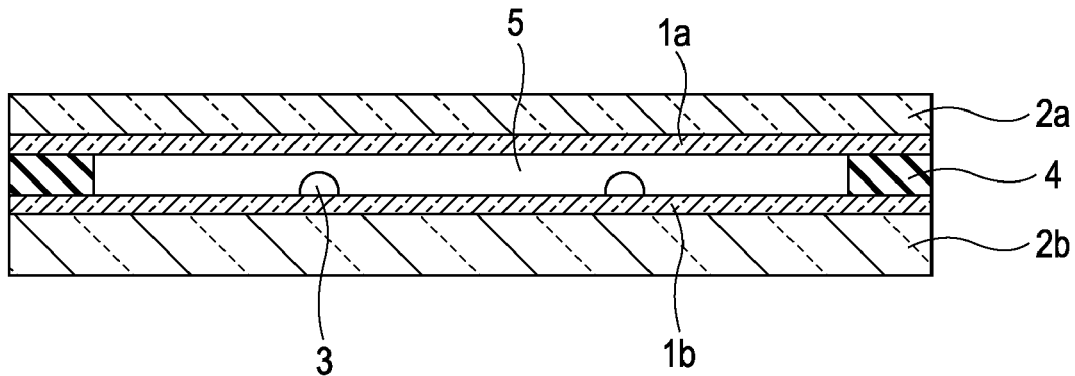
FIGS. 10A and 10B are cross-sectional views each showing a touch panel using a transparent conductive film according to a fourth embodiment of the present invention, FIG. 10A showing the touch panel being not pressed, and FIG. 10B showing the touch panel being pressed.
Figure 10B:
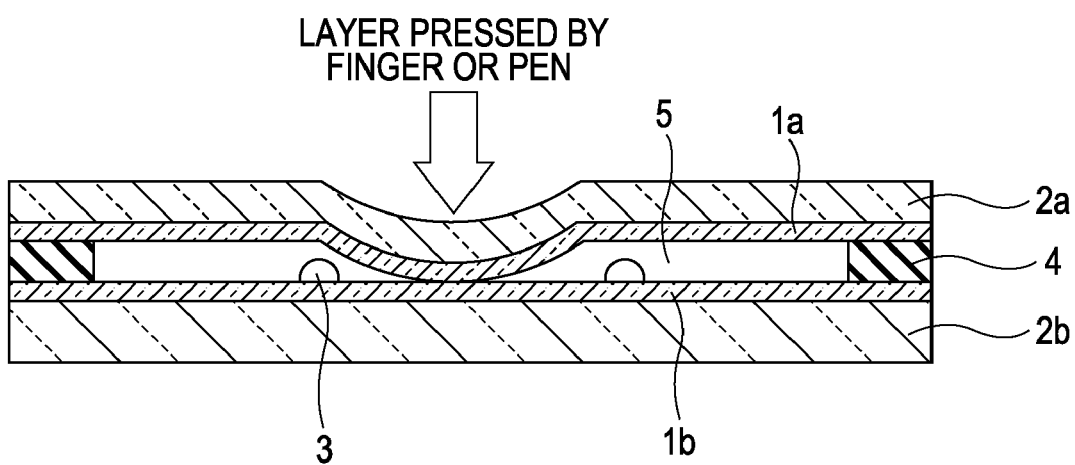

FIGS. 10A and 10B are views showing a fourth embodiment of the present invention that is applied to a touch panel using a transparent conductive film.

In general, since a touch panel is provided on a liquid crystal display (LCD) or a cathode ray tube (CRT), an optical transparency of 80% or more is necessary in the visible light region, and in an analog method using a resistor film touch panel, a film forming an electrode is desired to have a sheet resistance of 500 $\Omega$/sq. or less and uniformity thereof (the same as described above is also applied to a transparent conductive film of another device).

As shown in a cross-sectional view of FIG. 10A, the transparent touch panel is formed of a deformable PET substrate (top substrate) 2a on which a transparent conductive film 1a is formed as a top electrode and a glass substrate (bottom substrate) 2b on which a transparent conductive film 1b is formed as a bottom electrode, the film 1b being provided with electrical insulating dot spacers 3 on the surface thereof, and the top substrate 2a and the bottom substrate 2b are bonded to each other with an electric insulating layer 4 interposed therebetween so that the two electrodes 1a and 1b face each other while a small gap (air space) 5 is maintained therebetween.

For example, the gap 5 between the top substrate 2a and the bottom substrate 2b is 100 to 300 $\mu m$, and the height of the dot spacer 3 with respect to this gap 5 is set to approximately 5 to 50 $\mu m$ so as to prevent the top and the bottom electrodes 1a and 1b from being placed in a constant contact state, that is, from being placed in a constant ON state, and so as not to adversely influence an image displayed on a panel. In the state in which the two electrodes are not in contact with each other, the small dot spacers 3 prevent the contact between the two electrodes, current is not allowed to flow. In addition, the top electrode 1a is formed of an ITO (indium doped tin oxide) film, and the bottom electrode 1b may also be formed of ITO.

As shown in FIG. 10B, when a predetermined position at one side of the PET substrate 2a is pressed by a finger or a dedicated pen, a portion of the PET substrate 2a that is touched thereby is deformed and warped downward so that a current flows through the contact between the transparent conductive films 1a and 1b, and a switch operation is driven, so that an input is detected.

In the above touch panel, for example, when the transparent conductive film 1a (and also the bottom electrode 1b) is formed of the CNT thin film described above, and this CNT thin film is formed by the method described in the first or the second embodiment so as to have high orientation and a uniform thickness, necessary conductivity and transparency can be obtained.

According to the embodiments described above, the thin films 1a or 1b can be formed to be highly oriented along the sliding direction of the dispersion film 31 and the substrate 2a or 2b. By the thin film thus formed, the electrode 1a or 1b (or wire) having anisotropic electrical and optical properties in the orientation direction can be formed.

EXAMPLES

Hereinafter, particular examples of the present invention will be described in detail; however, the present invention is not limited thereto.

Example 1

1. In this example, in accordance with the first embodiment described above, the substrate 37 (A4 size: 210 mm by 297 mm) formed of PMMA (poly(methyl methacrylate)) having a thickness of 75 $\mu m$ was washed with water for one minute.

2. Subsequently, CNTs (single-wall CNTs or SWNTs) were added to an aqueous solution containing 1% of SDBS (sodium dodecyl benzene sulfonate) and were then processed by a homogenizing treatment using an ultrasonic homogenizer at an output of 50 W for 10 minutes to form the dispersion 8. The SWNTs were P3-SWNTs manufactured by Carbon Solutions Inc.

3. Next, the substrate holding member 47 having a hollow cylindrical shape was formed from polystyrene to have an outer circumference of 297 mm, an inner circumference of 285 mm, and a height of 210 mm.

4. Subsequently, the substrate 37 was wound around the substrate holding member 47 to cover the entire outer peripheral surface thereof and was then fixed by an adhesive tape.

5. Next, the dispersion-film holding ring 35 having an inner circumference of 330 mm and the cylindrical holding member 47 provided with the cylindrical substrate 37 formed in the above 4 were coaxially fixed.

6. Subsequently, the dispersion-film holding ring 35 was moved downward to be immersed in the CNT dispersion formed in the above 2 and was then moved upward, so that the dispersion film 31 was formed inside the ring 35.

7. Next, while the cylindrical substrate 37 and the dispersion-film holding ring 35 were placed in a coaxial state, the holding member 47 was moved downward, so that the cylindrical substrate 37 was brought into contact with the dispersion film 31 perpendicularly thereto.

8. Subsequently, while the coaxial state was maintained, the substrate support portion 6 was slide-moved downward 210 mm so that the cylindrical substrate 37 passes through the dispersion film 31. A slide moving speed at this stage was 40 mm/sec.

9. Next, the cylindrical substrate 37 was slide-moved upward 210 mm so as to be apart from the dispersion film 31. The slide moving speed was also 40 mm/sec at this stage.

10. In addition, the slide movements of the above 8 and 9 were repeatedly performed 10 times.

11. Subsequently, the cylindrical substrate 37 was separated from the dispersion film 31 and was then dried.

12. Next, after the cylindrical substrate 37 was immersed in purified water for 10 minutes for washing, remaining water droplets were removed.

13. A dispersion film remaining inside the holding ring 35 was ruptured by an air blow, so that the holding ring 35 was ready to be reused.

14. In addition, the above 6 to 13 were repeated 6 times (the total number of reciprocative slide movements was 60 times).

Example 2

In this example, the operation was performed in a manner similar to that of the above Example 1 except that the conditions were changed as shown below.

Size of the substrate 37: 130 mm by 220 mm Surfactant: 1% aqueous solution of alkyl ether sodium sulfate Size of the substrate holding member 47: outer circumference: 130 mm, inner circumference: 126 mm, and height: 220 mm Inner circumference of the dispersion-film holding ring 35: 140 mm Slide moving distance: 220 mm Number of reciprocative slide movements of the substrate 37: total 50 times (the above 6 to 13 were repeated 5 times).

Example 3

In this example, the operation was performed in a manner similar to that of the above Example 1 except that the conditions were changed as shown below.

Material of the substrate 37: PET (poly(ethylene terephthalate)) having a thickness of 125 μm Size of the substrate holding member 47: outer circumference: 210 mm, inner circumference: 205 mm, and height: 297 mm Inner circumference of the dispersion-film holding ring 35: 240 mm Slide moving distance: 148 mm Slide moving speed: 30 mm/sec Number of reciprocative slide movements of the substrate 37: total 50 times (the above 6 to 13 were repeated 5 times).

Example 4

In this example, the operation was performed in a manner similar to that of the above Example 1 except that the conditions were changed as shown below.

Material of the substrate 37: PET (poly(ethylene terephthalate)) having a thickness of 250 μm Size of the substrate 37: 148 mm by 210 mm Size of the substrate holding member 47: outer circumference: 210 mm, inner circumference: 200 mm, and height: 148 mm Inner circumference of the dispersion-film holding ring 35: 220 mm Slide moving distance: 148 mm Slide moving speed: 30 mm/sec Number of reciprocative slide movements of the substrate 37: total 50 times (the above 6 to 13 were repeated 5 times).

Next, performance evaluation of the CNT thin film obtained in each Example will be described.

Figure 11A:
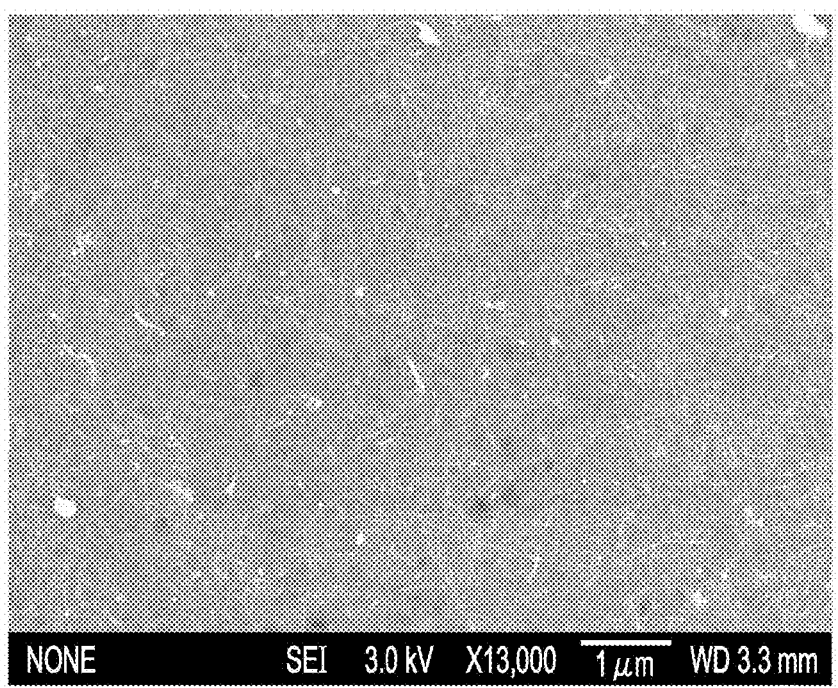
FIGS. 11A and 11B each showing a SEM image of a CNT thin film according to Example 3 of the present invention (number of reciprocative slide movements: 50 times)
Figure 11B:
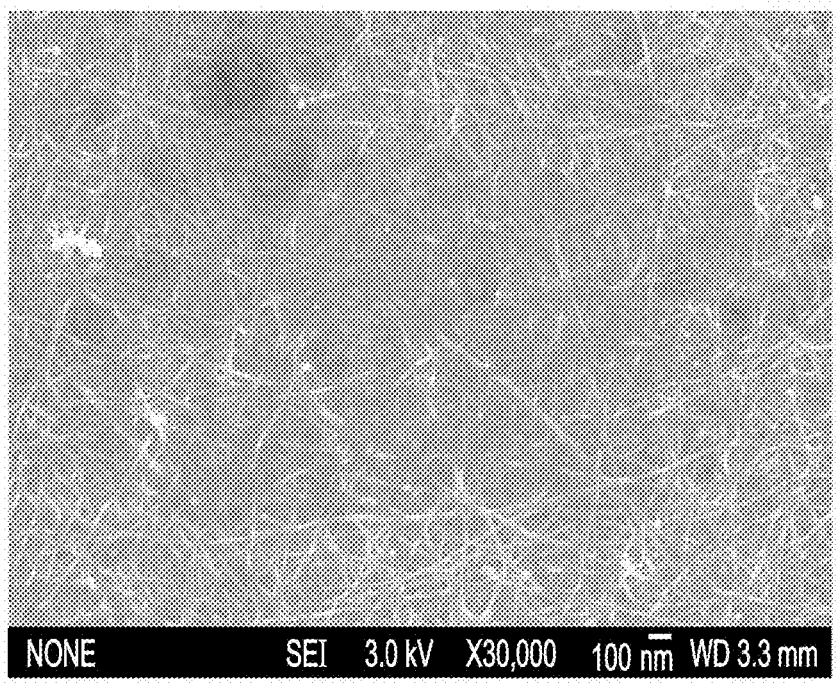

First, in Example 3, a SWNT transparent conductive film was obtained that was shown by scanning electron microscopic (SEM) images of FIGS. 11A and 11B at different magnifications.

Figure 12A:
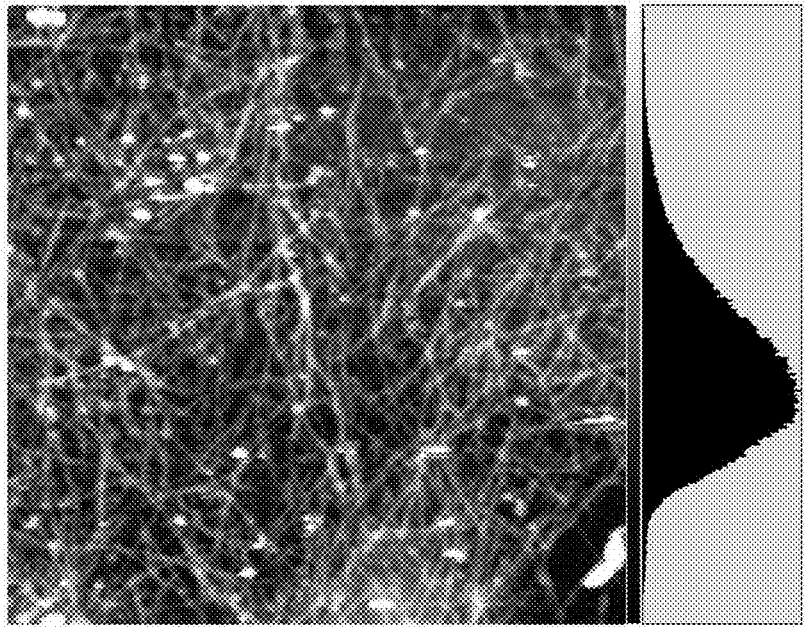
FIGS. 12A and 12B each showing an AFM image and an irregularity distribution curve of the CNT thin film according to Example 3 of the present invention.
Figure 12B:
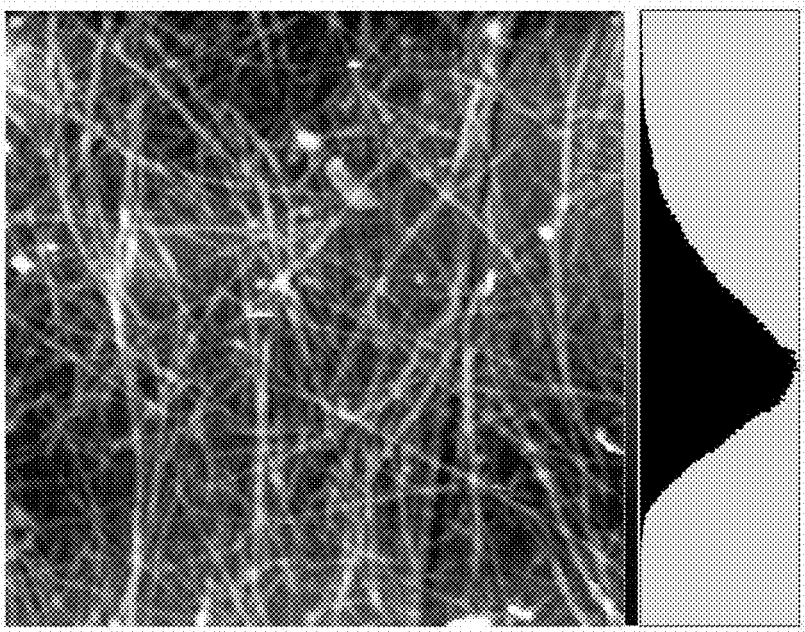

In addition, this SWNT transparent conductive film was formed as the CNT thin film 18 that had AFM images and surface irregularity distributions (total distribution of height profile on the substrate surface) as shown in FIGS. 12A and 12B (however, FIGS. 12(A) and 12(B) show different regions in the thin film). According to FIGS. 12A and 12B, it is clearly found that a portion in which linear CNTs are oriented along approximately one direction is present (the other Examples also had a similar result).

Figure 13:
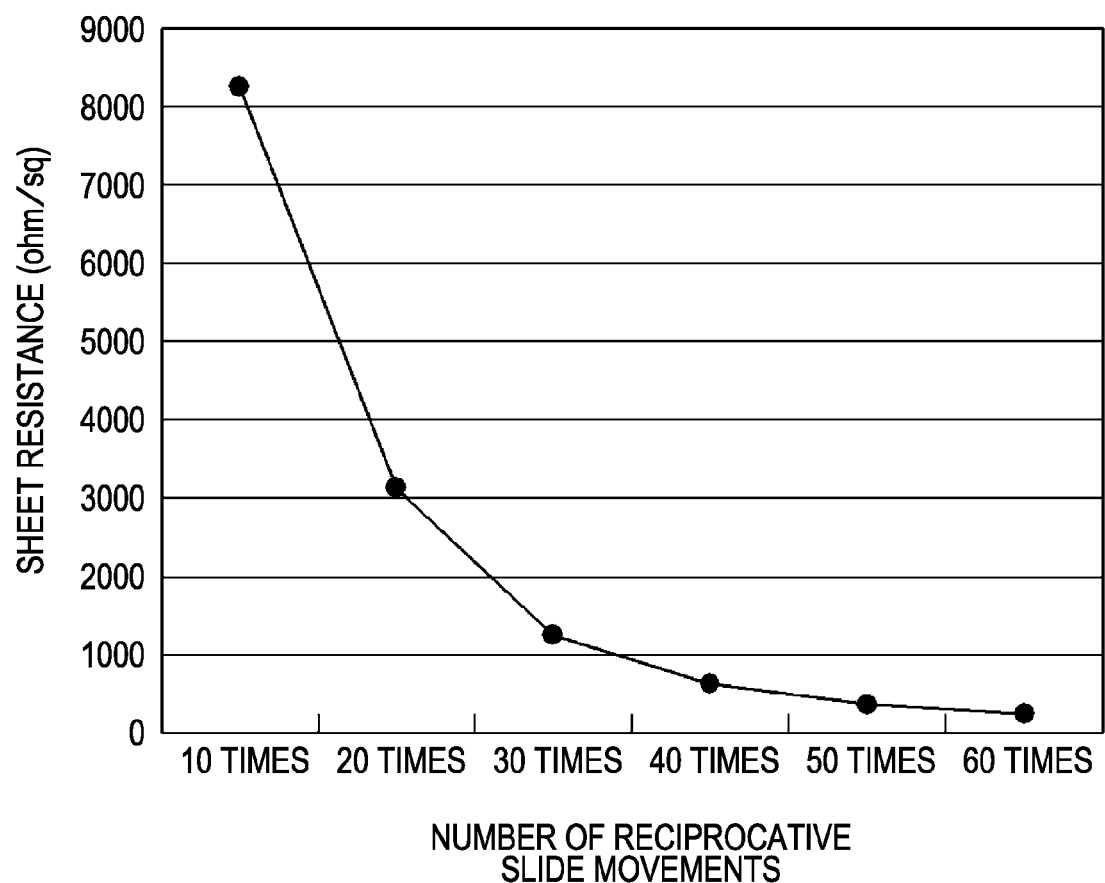
FIG. 13 is a graph showing the relationship between the number of reciprocative slide movements and the sheet resistance of a CNT thin film according to Example 2 of the present invention.

Next, in Example 2, as shown in FIG. 13, the sheet resistance of the CNT thin film changed with the change in total number of reciprocative slide movements. According to this result, it is found that the sheet resistance decreases as the number of reciprocative slide movements is increased. The reason for this is that the thickness of the CNT thin film 18 formed on the substrate 37 is increased as the number of reciprocative slide movements is increased, and hence the conductivity of the thin film is improved.

Figure 14:
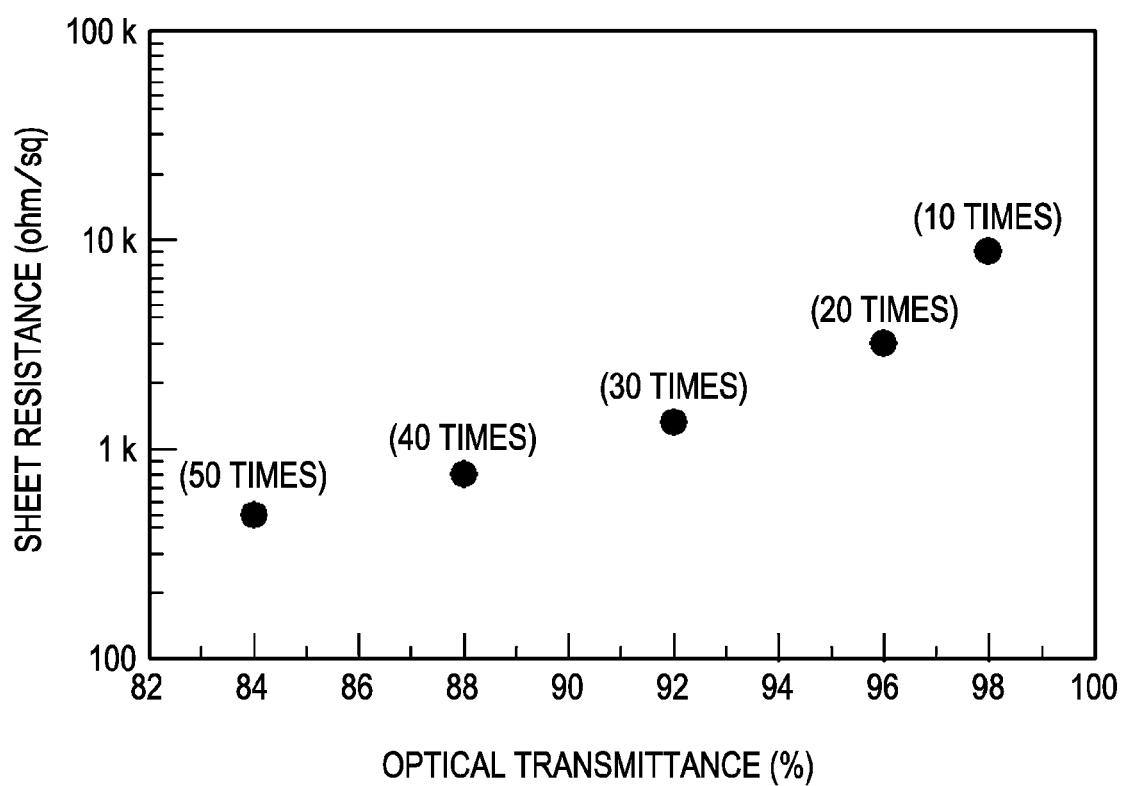
FIG. 14 is a graph showing the relationship between the optical transparency and the sheet resistance of the CNT thin film according to Example 2 of the present invention.

FIG. 14 is a graph showing the relationship between the sheet resistance of the CNT thin film and the optical transmittance thereof. According to this relationship, it is found that the sheet resistance or the optical transmittance can be arbitrarily controlled by controlling the number of reciprocative slide movements, and for example, in order to obtain a sheet resistance of 500 Ω/sq. or less and an optical transmittance of 80% or more, the number of reciprocative slide movements may be set to 50 times or more (particularly, 60 times or more).

Figures 15A, 15B:
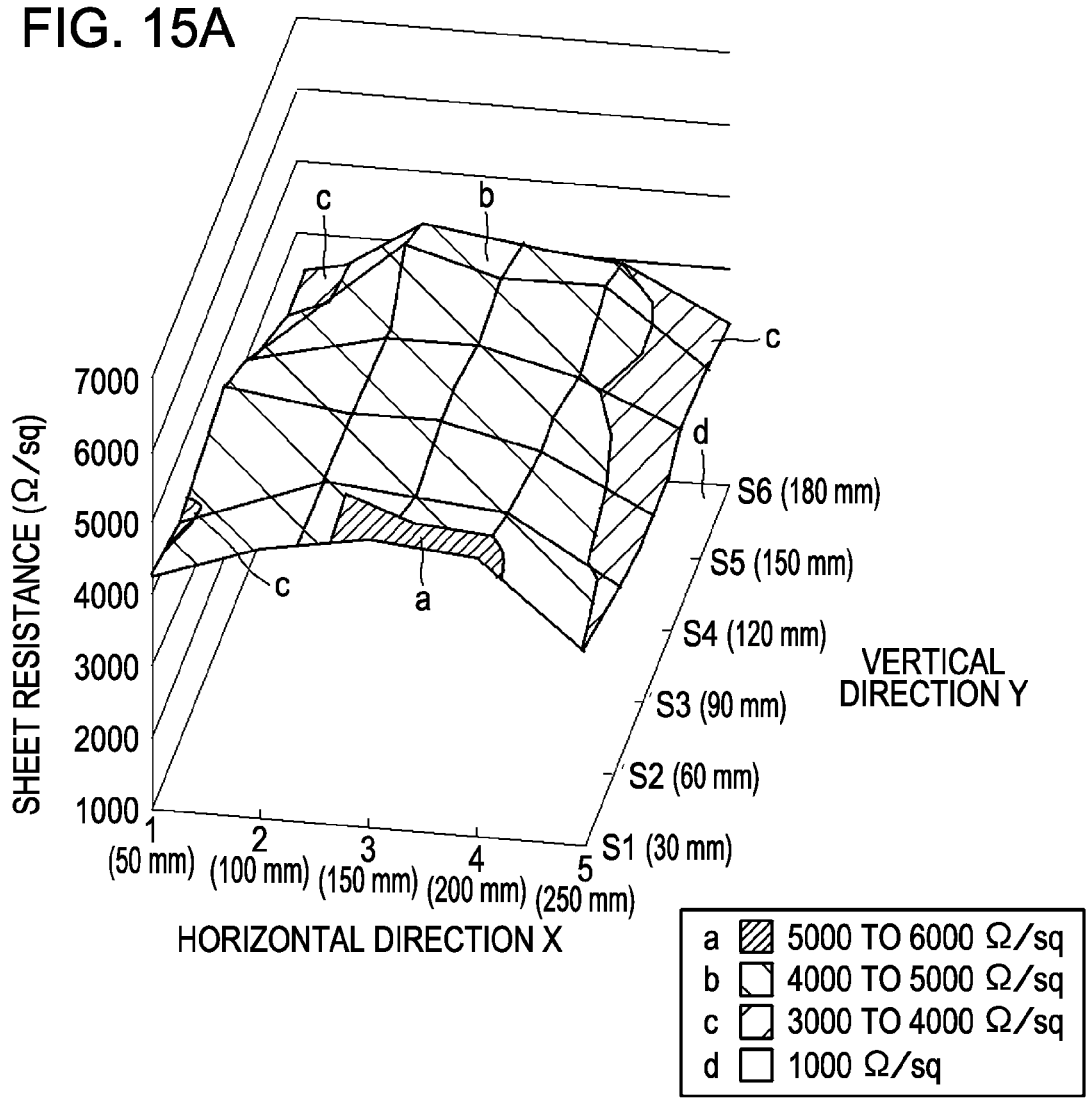
FIG. 15A is a perspective view showing, in a three-dimensional manner, the sheet resistance at each coordinate point of the CNT thin film according to Example 2 of the present invention.
FIG. 15B shows a distribution table of the sheet resistance of the CNT thin film according to Example 2 of the present invention.
Figure 16B:
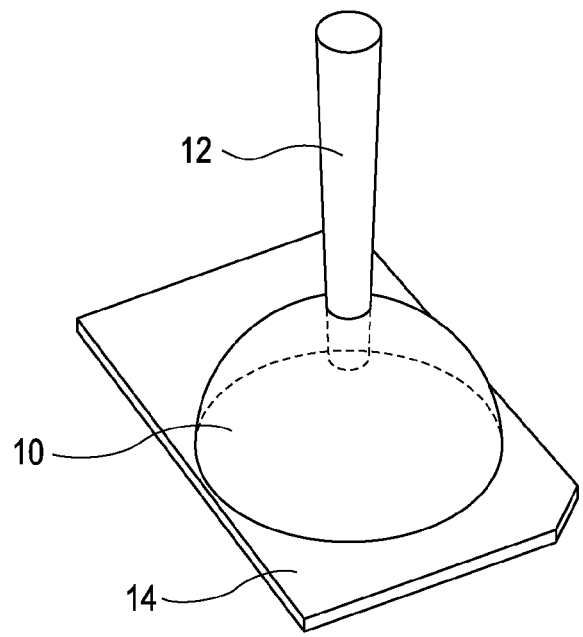
Figure 16C:
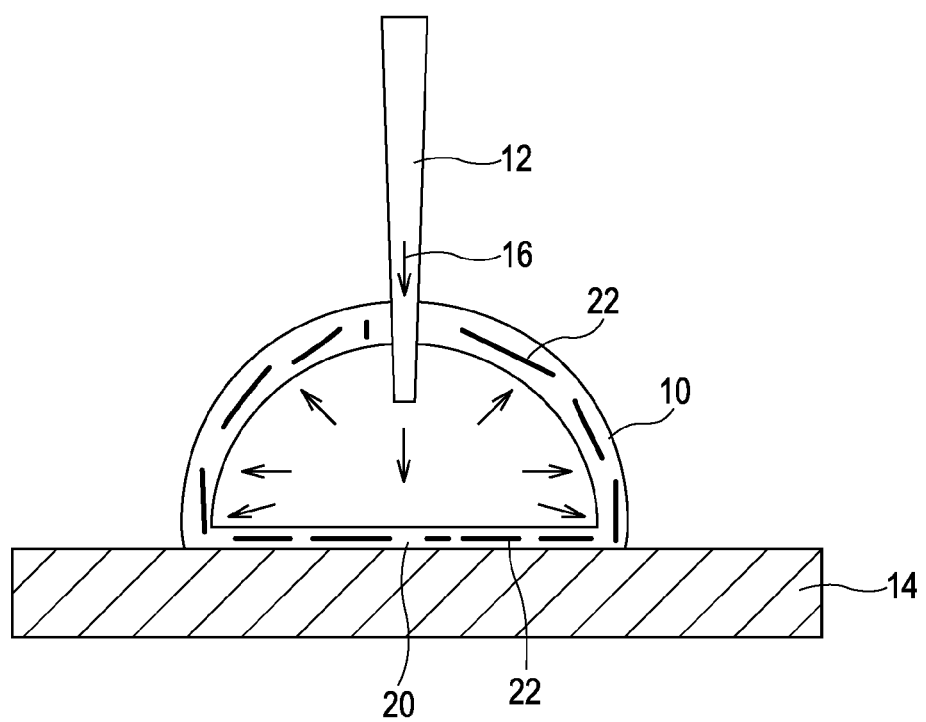
Figure 17:
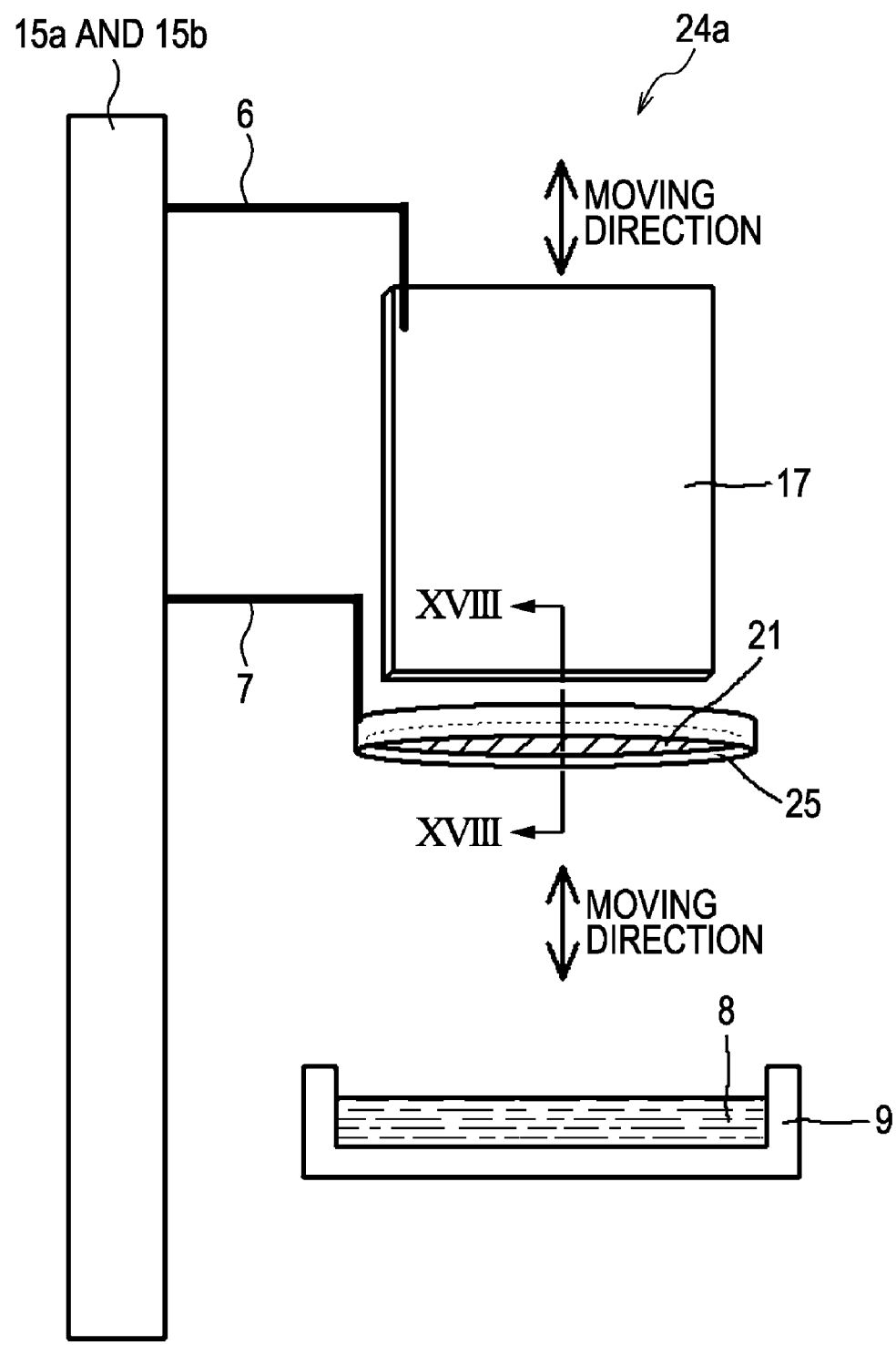
FIG. 17 is a schematic front view showing a thin-film manufacturing apparatus according to another prior invention.
Figure 18A:
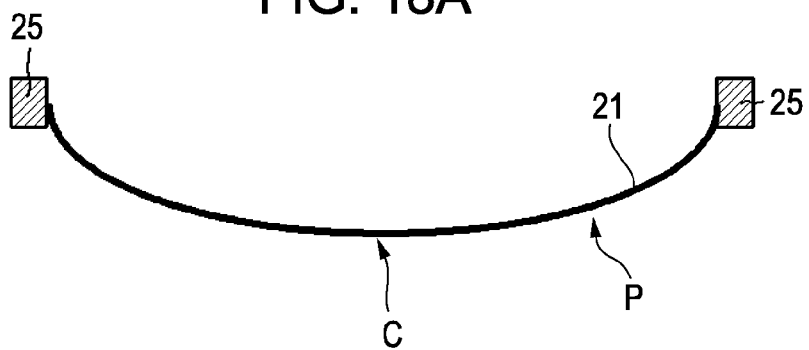
FIGS. 18A to 18C are cross-sectional view illustrating the state of manufacturing a thin film according to the prior invention in FIG. 17.
Figure 18B:
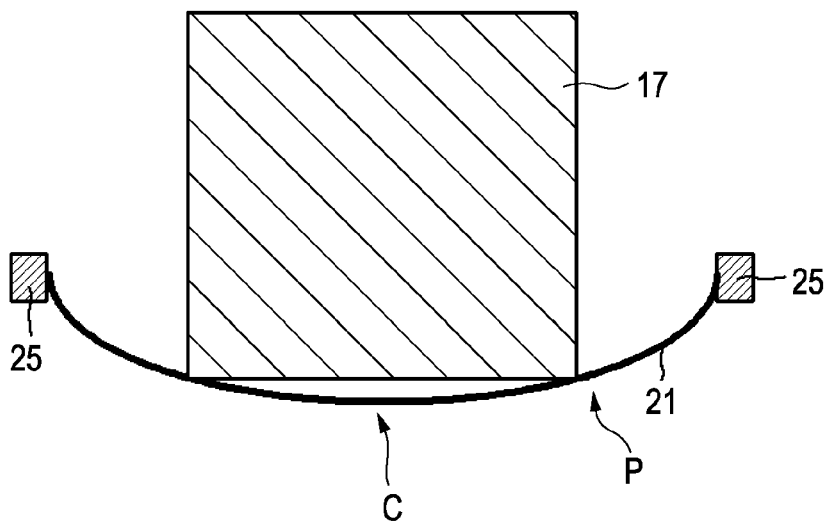
Figure 18C:
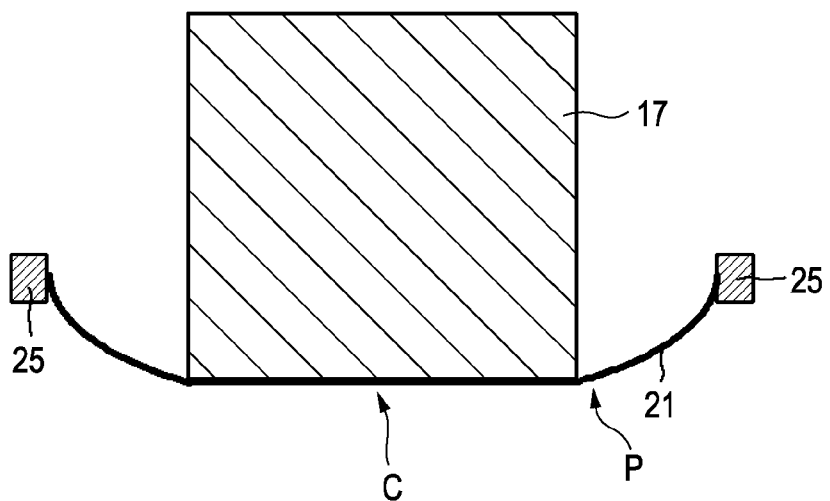

FIG. 15A is a perspective view showing, in a three-dimensional manner, the distribution of sheet resistance of the conductive thin film 18 formed in Example 2, and FIG. 15B shows the sheet resistance of the conductive thin film 18 at each coordinate point (the horizontal direction X and the vertical direction Y shown in FIG. 3 are directions when a thin film having a cylindrical shape is spread out into a flat sheet). According to FIGS. 15A and 15B, the sheet resistances at the different positions of the thin film 18 are approximately equivalent to each other, and the average value is 4,284 Ω/sq.; hence, it is understood that a target thin film is obtained.

Heretofore, although the embodiments and examples of the present invention have been described, those may be variously changed and/or modified without departing from the technical scope of the present invention.

For example, the material and the shape of the above substrate 37 may be arbitrarily determined whenever necessary. The horizontal cross sections of the substrate 37 and the ring 35 may have an oval or a rectangular shape, and the substrate 37 may also have an indeterminate form. In addition, in order to fix the substrate 37 to the holding member 47, after wound around the member 47, the substrate 37 may be fixed by an adhesive tape or an adhesive (in both cases, the substrate 37 is configured to be separable after the film formation).

In addition, the conditions, such as the type of material forming the thin film 18, the type of surfactant contained in the dispersion 8, and the concentration of the surfactant, may be arbitrarily and appropriately determined whenever necessary.

In addition, although the substrate 37 is reciprocatively slide-moved with respect to the dispersion film 31, the dispersion film 31 may be reciprocatively slide-moved with respect to the substrate 37, or the dispersion film 31 and the substrate 37 may both be moved at different speeds.

As for the type of material forming the thin film 18, as the one-dimensional nanomaterial, besides single layer CNTs, for example, there may be used two-layer or multilayer CNTS; a polymer (connected body) of fullerene; metal nanowires of Cu, Ag, Au, Ni, Co, Sn, and the like; oxide nanowires of $TiO_2$, $SnO_2$, ZnO, and the like; and organic nanofibers of cellulose and the like.

The present application contains subject matter related to that disclosed in Japanese Priority Patent Application JP 2008-207666 filed in the Japan Patent Office on Aug. 12, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a thin film, comprising:
    mixing a thin-film forming material and a surfactant to prepare a dispersion in which the thin-film forming material is dispersed;
    forming a dispersion film from the dispersion at an inner circumference side of ring-shaped holding means; wherein forming the dispersion film comprises immersing at least a portion of the ring-shaped holding means in the dispersion;
    relatively moving a cylindrical supporter and the dispersion film, while the cylindrical supporter and the dispersion film in contact with each other so that the dispersion is transferred to a surface of the cylindrical supporter with a film shape, the cylindrical supporter being disposed between a central portion of an inside space of the ring-shaped holding means and an outer circumference of the ring-shaped holding means and along an inner circumference of the ring-shaped holding means; and
    drying the dispersion having the film shape formed on the surface of the cylindrical supporter to form the thin film.

2. The method for manufacturing a thin film according to claim 1, wherein the ring-shaped holding means is disposed in a horizontal direction, the dispersion film is formed in the horizontal direction, and the cylindrical supporter is reciprocatively moved relative to a vertical direction.

3. The method for manufacturing a thin film according to claim 1, wherein the outer circumference of the cylindrical supporter has a similar shape to that of the outer circumference of the dispersion film.

4. The method for manufacturing a thin film according to claim 3, wherein a center of the cylindrical supporter is coaxial with a center of the dispersion film.

5. The method for manufacturing a thin film according to claim 4, wherein the cylindrical supporter and the ring-shaped holding means each have a circular outer or a circular inner circumference.

6. The method for manufacturing a thin film according to claim 1, wherein the cylindrical supporter is fixed to an outside surface of a cylindrical holding member.

7. The method for manufacturing a thin film according to claim 1, wherein the relative moving is performed only by the cylindrical supporter.

8. The method for manufacturing a thin film according to claim 1, wherein the thin-film forming material is oriented in a direction of the relative moving.

9. The method for manufacturing a thin film according to claim 1, further comprising:
    washing the cylindrical supporter after the drying to remove unnecessary residues.

10. The method for manufacturing a thin film according to claim 1, further comprising;
    Repeating the forming, relative moving, and drying to form the thin film having a thickness.

11. The method for manufacturing a thin film according to claim 1, wherein the relatively moving comprises moving the cylindrical supporter is relatively moved with respect to the dispersion film in a direction along which the cylindrical supporter will contact the dispersion film.

12. The method for manufacturing a thin film according to claim 1, wherein the cylindrical supporter includes a transparent high molecular weight substrate.

13. The method for manufacturing a thin film according to claim 1, wherein the thin-film forming material is a one-dimensional nanomaterial.

14. The method for manufacturing a thin film according to claim 13, wherein the one-dimensional nanomaterial comprises carbon nanotubes.

15. A method for manufacturing an electronic device, comprising the steps of: mixing a thin-film forming material and a surfactant to prepare a dispersion in which the thin-film forming material is dispersed;
    forming a dispersion film from the dispersion at an inner circumference side of ring-shaped holding means; wherein forming the dispersion film comprises immersing at least a portion of the ring-shaped holding means in the dispersion;
    relatively moving a cylindrical supporter and the dispersion film while being in contact with each other so that the dispersion is transferred on a surface of the cylindrical supporter to have a film shape, the cylindrical supporter being disposed between a central portion of an inside space of the holding means and an outer circumference thereof and along an inner circumference of the holding means; and drying the dispersion having a film shape formed on the surface of the supporter to form the thin film.

16. The method for manufacturing an electronic device, according to claim 15, wherein forming the thin film comprises forming a transparent electrode or a conductive path having a specified conductivity and/or optical transparency.

17. The method for manufacturing an electronic device, according to claim 15, wherein the electronic device comprises a liquid crystal device, an electroluminescent device, an electrochromic device, a field effect transistor, a touch panel, and/or a solar cell.

* * * * *